United States Patent
Orihara et al.

(10) Patent No.: US 8,094,227 B2
(45) Date of Patent: Jan. 10, 2012

(54) SOLID STATE IMAGE SENSOR

(75) Inventors: Kozo Orihara, Kyoto (JP); Shunjiro Takemori, Kyoto (JP); Akiyoshi Kohno, Kyoto (JP)

(73) Assignee: Panasonic Corporation, Osaka (JP)

( * ) Notice: Subject to any disclaimer, the term of this patent is extended or adjusted under 35 U.S.C. 154(b) by 423 days.

(21) Appl. No.: 12/307,984

(22) PCT Filed: Jul. 12, 2007

(86) PCT No.: PCT/JP2007/063879
§ 371 (c)(1),
(2), (4) Date: Jan. 8, 2009

(87) PCT Pub. No.: WO2008/007726
PCT Pub. Date: Jan. 17, 2008

(65) Prior Publication Data
US 2009/0303370 A1    Dec. 10, 2009

(30) Foreign Application Priority Data
Jul. 12, 2006 (JP) ................................. 2006-190997

(51) Int. Cl.
*H04N 3/14* (2006.01)
*H04N 5/335* (2011.01)
(52) U.S. Cl. ........................................ 348/312
(58) Field of Classification Search .......... 348/320–324, 348/312
See application file for complete search history.

(56) References Cited

U.S. PATENT DOCUMENTS

| 5,387,934 A | * | 2/1995 | Nakamura | 348/312 |
| 2002/0154236 A1 | * | 10/2002 | Sakurai et al. | 348/312 |
| 2005/0073589 A1 | * | 4/2005 | Wakito | 348/207.99 |

FOREIGN PATENT DOCUMENTS

| JP | 11-225252 | | 8/1999 |
| JP | 11225252 A | * | 8/1999 |
| JP | 2001-28672 | | 1/2001 |
| JP | 2004-229058 | | 8/2004 |
| JP | 2006-352621 | | 12/2006 |

OTHER PUBLICATIONS

Machine Translation of Japanese Patent Publication 11-225252-A.*

* cited by examiner

*Primary Examiner* — Sinh Tran
*Assistant Examiner* — Jason Flohre
(74) *Attorney, Agent, or Firm* — Steptoe & Johnson LLP

(57) ABSTRACT

A solid state image sensor capable of preventing image degradation, such as shading and ringing, from occurring in an image portion along the left edge of a screen. The solid state image sensor includes, in addition to a horizontal drive circuit that generates a horizontal drive pulse for driving a horizontal register, a pseudo-horizontal drive circuit that generates a pseudo-horizontal drive pulse successive to the horizontal drive pulse during a horizontal blanking interval. The horizontal drive circuit and pseudo-horizontal drive circuit are connected to a horizontal driver power supply unit, which generates, during the horizontal blanking interval, a current that is equal to a current generated by the horizontal driver power supply unit during an effective interval. This arrangement can prevent any power supply ripples from occurring immediately after the beginning of the effective interval.

9 Claims, 24 Drawing Sheets

US 8,094,227 B2

SOLID STATE IMAGE SENSOR

The present application is based on International Application PCT/JP2007/063879, filed Jul. 12, 2007, which claims priority to Japanese Patent Application No. 2006-190997, filed Jul. 12, 2006, the entire contents of which are hereby incorporated by reference.

TECHNICAL FIELD

The present invention relates to a solid state image sensor to be used in a CCD camera or the like.

BACKGROUND ART

A conventional solid state image sensor will now be described with reference to the drawings. FIG. 20 shows an example of the configuration of a conventional interline transfer solid-state image pickup device.

As shown in FIG. 20, a solid-state image pickup device 100 includes, on a substrate, photodiodes (light receiving units) 101, readout gates 102, vertical registers 103, a horizontal register 104, and a floating diffusion layer charge detecting unit 105.

The two-dimensionally arranged photodiodes 101 photoelectrically convert incident light and accumulate a signal charge whose amount corresponds to the amount of incident light. The readout gates 102 read out the signal charge accumulated in the photodiodes 101 to the vertical registers 103. The vertical registers 103 transfer the signal charge received from the photodiodes 101 via the readout gates 102 in a vertical direction (first direction). The horizontal register 104 transfers the signal charge received from the vertical registers 103 in a horizontal direction (second direction) that is perpendicular to the aforementioned vertical direction. The charge detecting unit 105 provided on one end of the horizontal register 104 converts the signal charge received from the horizontal register 104 into a voltage signal. Hereinafter, an example involving a four-phase drive vertical register and a two-phase drive horizontal register will be described.

Subsequently, operations of a conventional solid state image sensor including the aforementioned solid-state image pickup device 100 will be briefly described.

First, the solid state image sensor causes light to be incident on the photodiode 101 for any interval. The photodiode 101 converts the incident light into a signal charge whose amount corresponds to the amount of incident light and accumulates the converted signal charge.

The solid state image sensor then turns on the readout gate 102 during a vertical blanking interval. The readout gate 102 that is now turned on sends the signal charge accumulated in the photodiode 101 to the vertical register 103.

Next, the solid state image sensor drives the vertical register 103 by vertical drive pulses $\phi V1$ to $\phi V4$ during a horizontal blanking interval. The vertical register 103 driven by the vertical drive pulses $\phi V1$ to $\phi V4$ performs a vertical-direction single stage transfer of the signal charge received from the readout gate 102. At this point, a signal charge existing in the final stage of the vertical register 103 is transferred to the horizontal register 104.

The solid state image sensor then drives the horizontal register 104 with horizontal drive pulses $\phi H1$ and $\phi H2$ during an effective interval. The horizontal register 104 driven by the horizontal drive pulses $\phi H1$ and $\phi H2$ transfers the signal charge received from the vertical register 103 in a horizontal direction and sends the signal charge to the charge detecting unit 105.

The charge detecting unit 105 converts the signal charge received from the horizontal register 104 into a voltage signal and outputs the converted voltage signal to the outside of the solid-state image pickup device 100.

FIG. 21 shows a part of a circuit of a conventional solid state image sensor. As shown in FIG. 21, the solid state image sensor includes a clock generator 1, a horizontal driver power supply unit 2, a first horizontal drive circuit 3, and a second horizontal drive circuit 4.

The clock generator 1 includes a logic circuit which generates clock pulses H1 and H2 having required periods and required amplitudes. The horizontal driver power supply unit 2 includes a power supplying terminal to be connected to the first horizontal drive circuit 3 and a power supplying terminal to be connected to the second horizontal drive circuit 4, and generates power to be supplied to the horizontal drive circuits 3 and 4.

The first horizontal drive circuit 3 generates a horizontal drive pulse $\phi H1$ based on a clock pulse H1. The second horizontal drive circuit 4 generates a horizontal drive pulse $\phi H2$ based on a clock pulse H2. The two horizontal drive circuits 3 and 4 are formed on the same circuit board (the same chip) 5.

Additionally, in FIG. 21, reference character L1 denotes a reactance component parasitic on a wire (power supply line) connecting the power supplying terminal of the horizontal driver power supply unit 2 and the power terminal of the first horizontal drive circuit 3. Furthermore, reference character L2 denotes a reactance component parasitic on a wire (power supply line) connecting the power supplying terminal of the horizontal driver power supply unit 2 and the power terminal of the horizontal drive circuit 4. Moreover, reference character IH1 denotes a current flowing from the horizontal driver power supply unit 2 to the first horizontal drive circuit 3. In addition, reference character IH2 denotes a current flowing from the horizontal driver power supply unit 2 to the second horizontal drive circuit 4.

FIG. 22 shows the configuration of the junction of the aforementioned vertical register 103 and the horizontal register 104. As shown in FIG. 22, the vertical register includes a transfer channel 201 and transfer electrodes 202 to 205. In addition, the horizontal register includes a transfer channel 206 and transfer electrodes 207 to 210.

Vertical drive pulses $\phi V1$ to $\phi V4$ are respectively applied to the transfer electrodes 202 to 205 of the vertical register. A potential barrier (not shown) is formed under the transfer electrodes 207 and 209 of the horizontal register. In addition, a horizontal drive pulse $\phi H1$ is applied to the transfer electrodes 207 and 208 of the horizontal register. A horizontal drive pulse $\phi H2$ is applied to the transfer electrodes 209 and 210 of the horizontal register.

FIG. 23 shows examples of signal waveforms of the horizontal drive pulses $\phi H1$ and $\phi H2$ generated by the first and second horizontal drive circuits 3 and 4, signal waveforms of the currents IH1 and IH2 flowing from the horizontal driver power supply unit 2 to the first and second horizontal drive circuits 3 and 4, and waveforms of a voltage (terminal voltage) applied to the power terminals of the first and second horizontal drive circuits 3 and 4. In addition, FIG. 24 shows an enlarged view of a portion A of the signal waveforms of the horizontal drive pulses $\phi H1$ and $\phi H2$ shown in FIG. 23.

As shown in FIG. 23, the horizontal drive pulses $\phi H1$ and $\phi H2$ are pulses that are in opposite phases to each other and normally have a low level of 0V and a high level of 3 to 5 V.

In addition, during a horizontal blanking interval, the horizontal drive pulse $\phi H1$ applied to the transfer electrodes 207 and 208 of the horizontal register is suspended in a high-level state and the horizontal drive pulse φH2 applied to the transfer electrodes 209 and 210 of the horizontal register is suspended in a low-level state. During the horizontal blanking interval, a signal charge existing in the final stage of the transfer channel 201 of the vertical register is transferred to under the transfer electrode 208 of the horizontal register.

After the horizontal blanking interval, the signal charge transferred to under the transfer electrode 208 of the horizontal register is transferred through the transfer channel 206 of the horizontal register by the horizontal drive pulses φH1 and φH2 in opposite phases to each other and is converted into a voltage signal at the charge detecting unit 105.

As described above, in the conventional solid state image sensor, horizontal drive pulses φH1 and φH2 which regulate the drive timing of the horizontal register are suspended in a horizontal blanking interval (refer to Patent Document 1).

However, in the conventional solid state image sensor, as shown in FIG. 23, while a current periodically flows from the horizontal driver power supply unit to the horizontal drive circuit during an effective interval in which a signal charge is transferred from the horizontal register to the charge detecting unit, hardly any current flows from the horizontal driver power supply unit to the horizontal drive circuit during a horizontal blanking interval. Consequently, a large current rapidly flows out from the horizontal driver power supply unit immediately after the start of an effective interval. Such a current variation generates a power supply ripple due to the influence of a reactance component parasitic on the power supply line connected to the horizontal driver power supply unit even when the voltage at the power supplying terminal of the horizontal driver power supply unit is constant. Therefore, immediately after the start of an effective interval, a ripple as shown in FIG. 23 is generated on a voltage (terminal voltage) applied to the power terminals of the horizontal drive circuits 3 and 4. Consequently, as shown in FIG. 24, the generation of the power supply ripple disturbs the phases of the horizontal drive pulses φH1 and φH2 immediately after the start of the effective interval by approximately several tens of bits.

As shown, disturbances in the phases of the horizontal drive pulses φH1 and φH2 immediately after the start of an effective interval cause image degradation. This image degradation will now be described with reference to FIGS. 25 and 26.

FIG. 25 is a schematic diagram of a voltage signal generated at a charge detecting unit of a conventional solid state image sensor. FIG. 26 is a schematic diagram showing a conventional image.

When disturbances in the phases of the horizontal drive pulses φH1 and φH2 occur immediately after the start of an effective interval, as shown in FIG. 25, the signal level of a voltage signal generated at the charge detecting unit 105 drops immediately after the start of the effective interval. Subsequently, as the signal level of the voltage signal generated at the charge detecting unit 105 drops immediately after the start of the effective interval, as shown in FIG. 26, image degradation such as shading or ringing occurs in an image portion along the left edge of a screen.

As shown, in the conventional solid state image sensor, a power supply ripple generated immediately after the start of an effective interval disadvantageously causes image degradation such as shading or ringing in an image portion along the left edge of a screen.

A power supply ripple can conceivably be prevented from occurring immediately after the start of the effective interval either by connecting a large-capacity capacitor to each power supplying terminal of the horizontal driver power supply unit in order to cancel the reactance components parasitic on the wires (power supply lines) connecting the power supplying terminals of the horizontal driver power supply unit with the power terminal of the horizontal drive circuit or by minimizing the lengths of the power supply lines in order to minimize the reactance components parasitic on the power supply lines. However, such measures may not be sufficiently implemented in some camera systems due to mounting restraints and therefore cannot be considered effective.

Patent Document 1: Japanese Patent Laid-Open No. 2004-229058

In consideration of the disadvantage described above, an object of the present invention is to provide a solid state image sensor capable of preventing a power supply ripple from being generated immediately after the start of an effective interval and preventing image degradation such as shading or ringing from occurring in an image portion along the left edge of a screen, by causing a current to be generated at a horizontal driver power supply unit during an interval in which a horizontal drive pulse is suspended (a horizontal blanking interval).

DISCLOSURE OF THE INVENTION

In order to achieve the object described above, a solid state image sensor according to the present invention includes: a light-receiving unit that converts incident light into a signal charge; a vertical register that transfers the signal charge converted by the light-receiving unit in a first direction; and a horizontal register that transfers the signal charge transferred by the vertical register in a second direction that differs from the first direction, wherein the solid state image sensor further includes: a horizontal drive circuit that generates a horizontal drive pulse for driving the horizontal register; a dummy load; a pseudo-horizontal drive circuit that generates a pseudo-horizontal drive pulse successive to the horizontal drive pulse and which drives the dummy load during an interval in which the horizontal drive pulse is suspended; and a power supply unit to be connected to the horizontal drive circuit and the pseudo-horizontal drive circuit.

Furthermore, a solid state image sensor according to the present invention is the solid state image sensor described above, wherein the power supply unit includes a power supplying terminal that similarly connects to the horizontal drive circuit and to the pseudo-horizontal drive circuit.

Furthermore, a solid state image sensor according to the present invention is the solid state image sensor described above, wherein the number of pseudo-horizontal drive circuits provided is the same as the number of horizontal drive circuits provided.

Furthermore, a solid state image sensor according to the present invention is the solid state image sensor described above, wherein the number of pseudo-horizontal drive circuits provided is less than the number of horizontal drive circuits provided.

Furthermore, a solid state image sensor according to the present invention is the solid state image sensor described above, wherein the power supply unit includes at least the same number of power supplying terminals as the number of the horizontal drive circuits.

Furthermore, a solid state image sensor according to the present invention is the solid state image sensor described above, including a plurality of the pseudo-horizontal drive circuits, wherein the dummy load includes: a first capacitor with one end connected to the pseudo-horizontal drive circuits and the other end grounded; and a second capacitor connected between the respective pseudo-horizontal drive circuits.

Furthermore, a solid state image sensor according to the present invention is the solid state image sensor described above, wherein the dummy load includes a parallel circuit made up of a capacitor and a resistor and having one end connected to the pseudo-horizontal drive circuit and the other end grounded.

Furthermore, a solid state image sensor according to the present invention is the solid state image sensor described above, wherein the horizontal drive circuit and the pseudo-horizontal drive circuit are formed on different circuit boards.

Furthermore, a solid state image sensor according to the present invention is the solid state image sensor described above, wherein the horizontal drive circuit and the pseudo-horizontal drive circuit are formed on the same circuit board.

According to preferred embodiments of the present invention, by causing a current to be generated at a power supply unit during a horizontal blanking interval (an interval in which a horizontal drive pulse is suspended), it is possible to suppress power supply ripples immediately after the start of an effective interval and to suppress occurrences of image degradation such as shading or ringing in an image portion along the left edge of a screen.

BEST MODE FOR CARRYING OUT THE INVENTION

First Embodiment

A solid state image sensor according to a first embodiment of the present invention will now be described.

Figure 20:
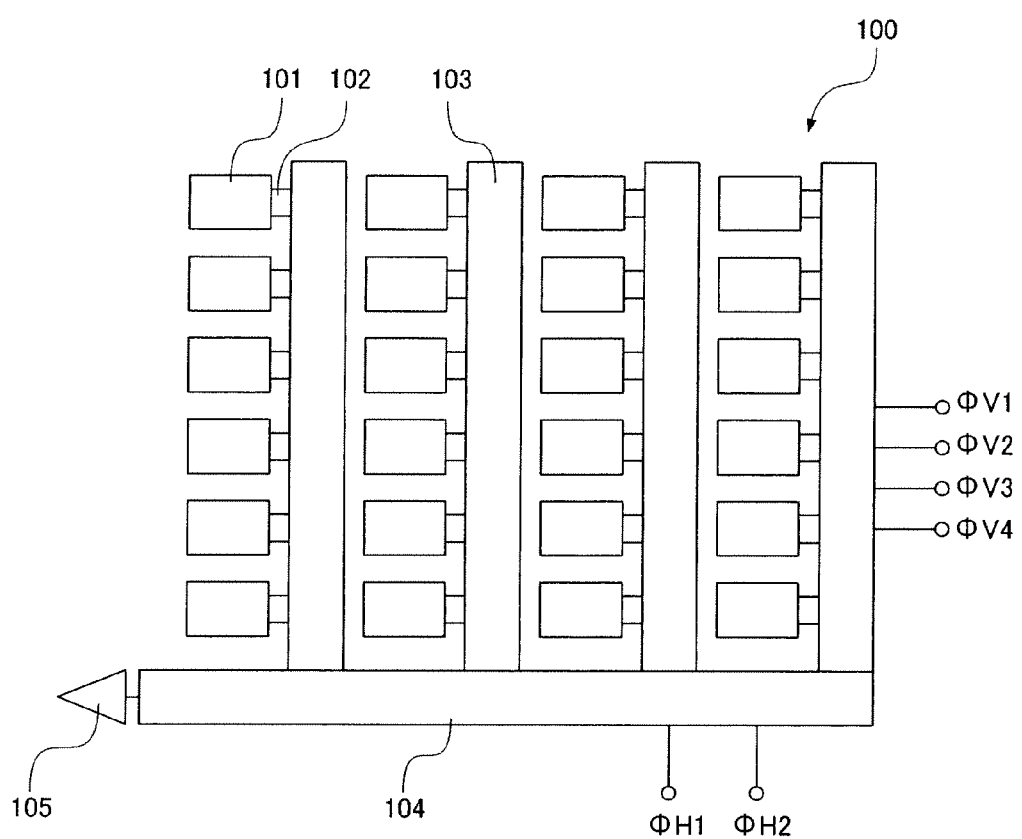
FIG. 20 is a diagram showing the configuration of a conventional solid-state image pickup device.

A solid-state image pickup device included in the solid state image sensor is of an interline transfer type and the configuration thereof is the same as the configuration of the conventional solid-state image pickup device 100 shown in FIG. 20.

Figure 22:
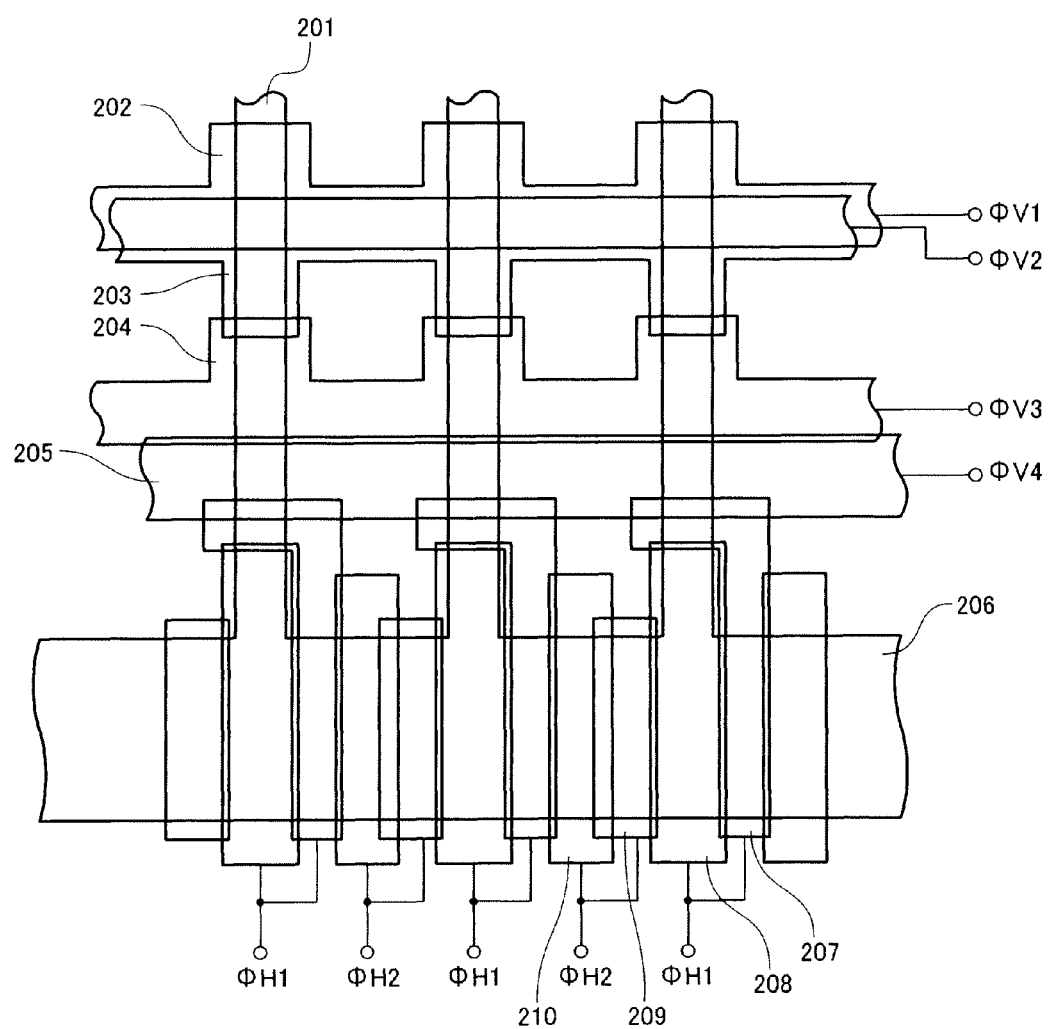
FIG. 22 is a plan view showing the configuration of the junction of a vertical register and a horizontal register in the conventional solid state image sensor.
Figure 23:
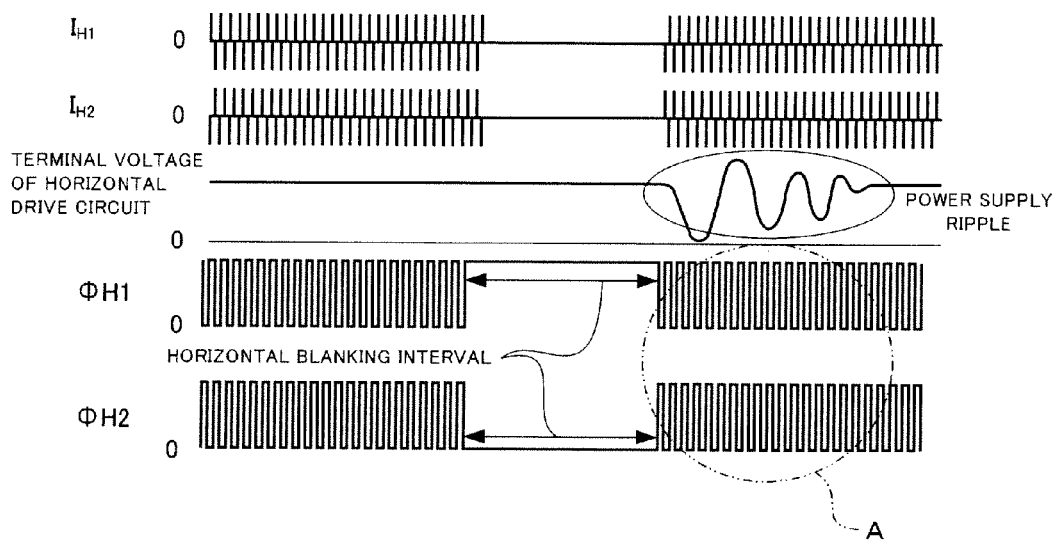
FIG. 23 is a diagram showing an example of respective signal waveforms of the conventional solid state image sensor.
Figure 24:
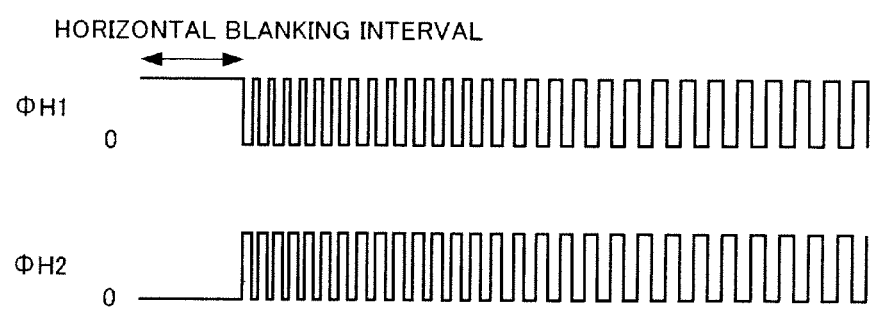
FIG. 24 is an enlarged view of a signal waveform of a horizontal drive pulse of the conventional solid state image sensor.
Figure 25:
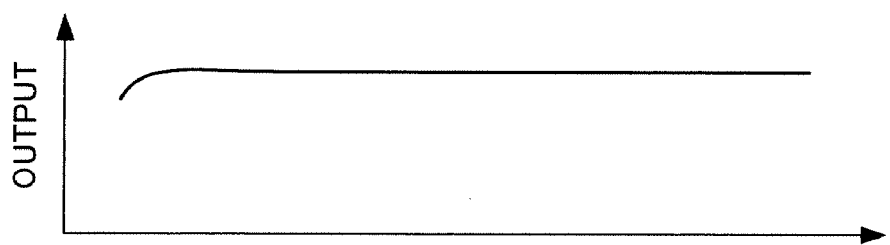
FIG. 25 is a schematic view of a voltage signal generated at a charge detecting unit of the conventional solid state image sensor.
Figure 26:
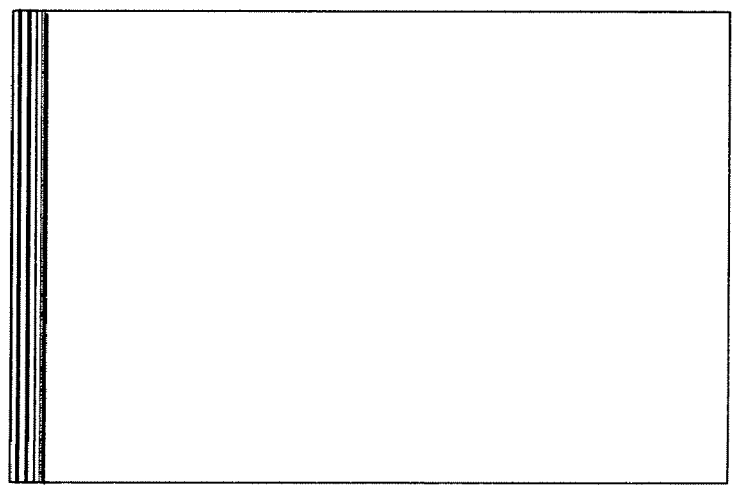
FIG. 26 is a schematic view of a conventional image.

In addition, the configuration of the junction of a vertical register and a horizontal register in the present solid state image sensor is similar to the configuration of the junction of the vertical register and the horizontal register of the conventional solid state image sensor shown in FIG. 22.

Hereinafter, an example involving a four-phase drive vertical register and a two-phase drive horizontal register will be described. However, it should be noted that the present invention is not limited to a four-phase drive vertical register and a two-phase drive horizontal register.

Figure 1:
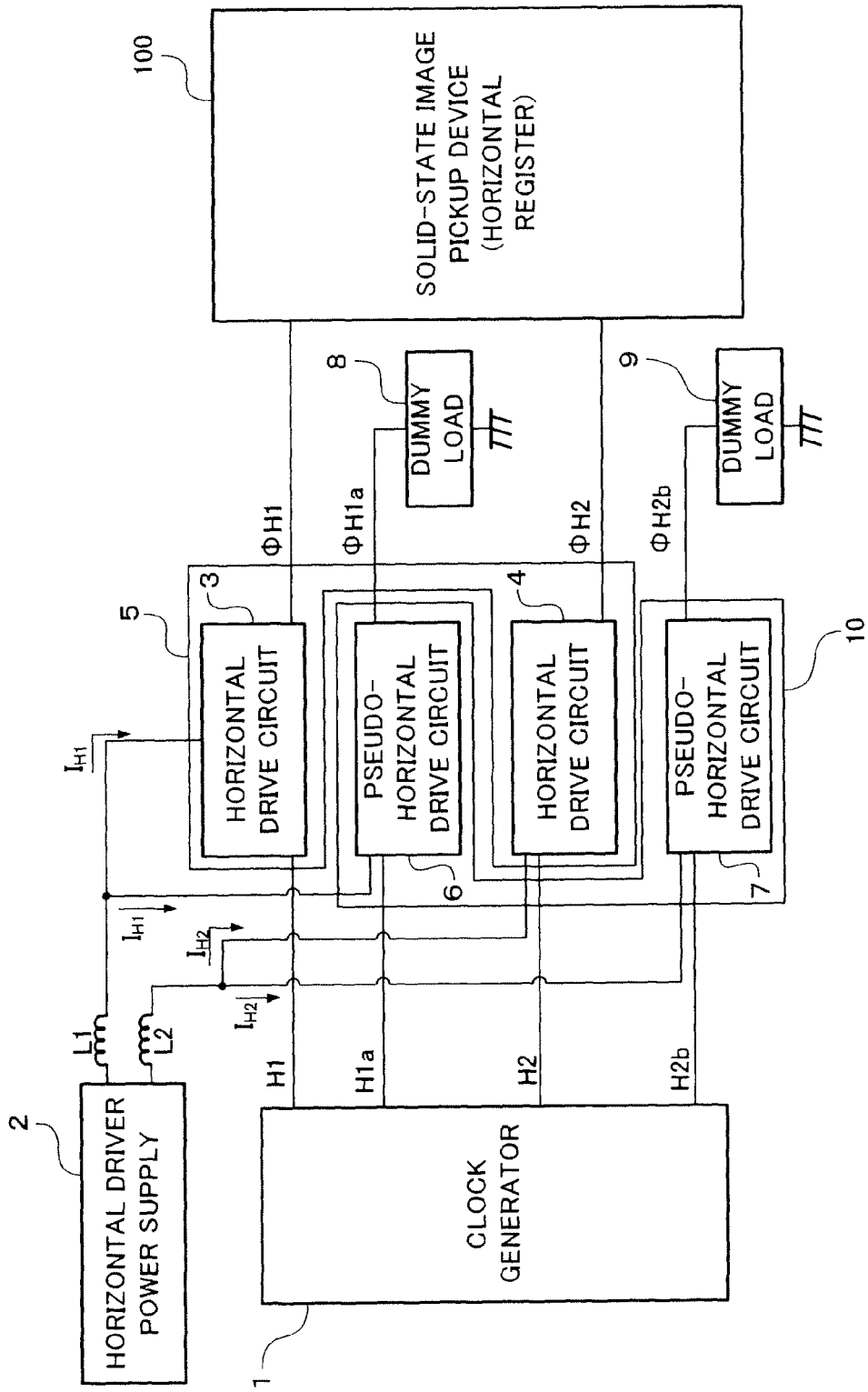
FIG. 1 is a block diagram partially showing a circuit of a solid state image sensor according to a first embodiment of the present invention.
Figure 21:
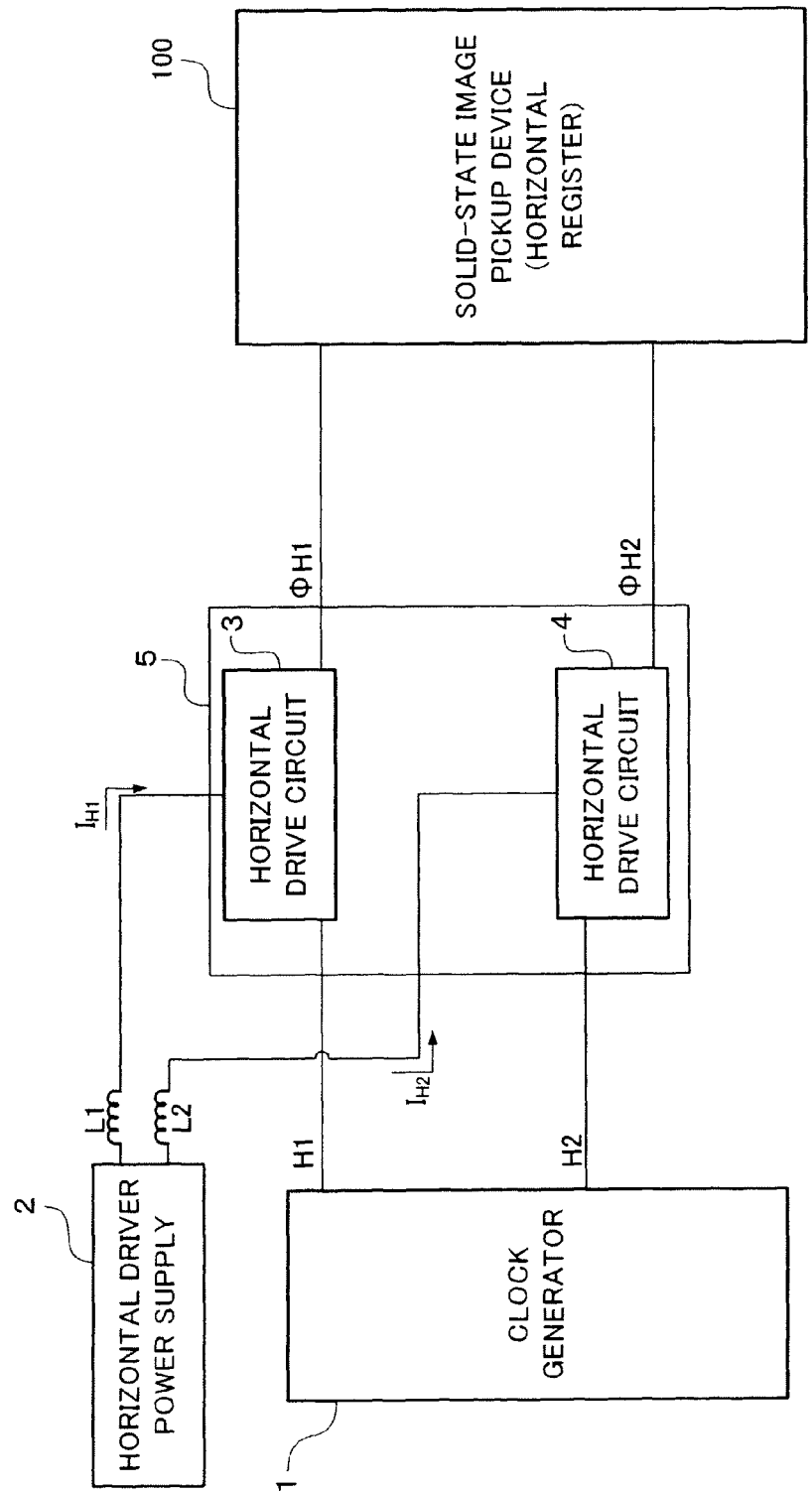
FIG. 21 is a block diagram partially showing a circuit of a conventional solid state image sensor.

FIG. 1 is a block diagram partially showing a circuit of the solid state image sensor according to the present first embodiment. Members corresponding to members described based on FIG. 21 mentioned earlier are assigned the same reference characters and detailed descriptions thereof shall be omitted.

As shown in FIG. 1, the solid state image sensor further includes a first pseudo-horizontal drive circuit 6, a second pseudo-horizontal drive circuit 7, a first dummy load 8, and a second dummy load 9. In addition, a clock generator 1 generates, in addition to clock pulses H1 and H2, clock pulses H1a and H2b having a required period and a required amplitude.

Based on the clock pulse H1a, the first pseudo-horizontal drive circuit 6 generates a pseudo-horizontal drive pulse φH1a that drives the first dummy load 8.

Based on the clock pulse H2b, the second pseudo-horizontal drive circuit 7 generates a pseudo-horizontal drive pulse φH2b that drives the second dummy load 9.

The first and second dummy loads 8 and 9 are constituted by capacitors having one ends of their ends connected to output terminals of the pseudo-horizontal drive circuits 6 and 7 and the other ends connected to GND. In other words, in an interline transfer solid-state image pickup device, the structure of a transfer electrode of a horizontal register is equivalent to a capacitor structure. Accordingly, by configuring the first and second dummy loads 8 and 9 with capacitors, an operating state of the solid state image sensor during a horizontal blanking interval can be approximated to an operating state during an effective interval.

Two horizontal drive circuits 3 and 4 are formed on the same circuit board (the same chip) 5 and the two pseudo-horizontal drive circuits 6 and 7 are formed on the same circuit board (the same chip) 10. As shown, in the present solid state image sensor, the horizontal drive circuits and the pseudo-horizontal drive circuits are formed on different circuit boards (different chips).

Furthermore, in FIG. 1, reference character L1 denotes a reactance component parasitic on a wire (power supply line) connecting a power supplying terminal of a horizontal driver power supply unit 2 and power terminals of the first horizontal drive circuit 3 and the first pseudo-horizontal drive circuit 6. In this case, a reactance component parasitic on a wire between the horizontal driver power supply unit 2 and the first horizontal drive circuit 3 is considered equal to a reactance component parasitic on a wire between the horizontal driver power supply unit 2 and the first pseudo-horizontal drive circuit 6.

In addition, reference character L2 denotes a reactance component parasitic on a wire (power supply line) connecting the power supplying terminal of the horizontal driver power supply unit 2 and power terminals of the second horizontal drive circuit 4 and the second pseudo-horizontal drive circuit 7. In this case, a reactance component parasitic on a wire between the horizontal driver power supply unit 2 and the second horizontal drive circuit 4 is considered equal to a reactance component parasitic on a wire between the horizontal driver power supply unit 2 and the second pseudo-horizontal drive circuit 7.

Furthermore, reference character IH1 denotes a current flowing from the horizontal driver power supply unit 2 to the first horizontal drive circuit 3 and the first pseudo-horizontal drive circuit 6, while IH2 denotes a current flowing from the horizontal driver power supply unit 2 to the second horizontal drive circuit 4 and the second pseudo-horizontal drive circuit 7.

In this case, it is assumed that the horizontal driver power supply unit 2 is provided with power supplying terminals respectively corresponding to the first and second horizontal drive circuits 3 and 4.

As described above, the solid state image sensor according to the present first embodiment includes, in addition to the horizontal drive circuits 3 and 4 which generate horizontal drive pulses φH1 and φH2, the pseudo-horizontal drive circuits 6 and 7 which generate the pseudo-horizontal drive pulses φH1a and φH2b successive to the horizontal drive pulses φH1 and φH2 during an interval in which the horizontal drive pulses φH1 and φH2 are suspended (horizontal blanking interval), and is arranged so that the horizontal drive circuits 3 and 4 and the pseudo-horizontal drive circuits 6 and 7 are connected to the horizontal driver power supply unit 2.

According to this configuration, a current is generated at the horizontal driver power supply unit 2 during a horizontal blanking interval and the current generated at the horizontal driver power supply unit 2 becomes constant.

In addition, the solid state image sensor is arranged so that the power terminal of the first pseudo-horizontal drive circuit 6 is connected to the power supplying terminal of the horizontal driver power supply unit 2 that connects to the power terminal of the first horizontal drive circuit 3, and the power terminal of the second pseudo-horizontal drive circuit 7 is connected to the power supplying terminal of the horizontal driver power supply unit 2 that connects to the power terminal of the second horizontal drive circuit 4. However, for example, power supplying terminals for pseudo-horizontal drive circuits may be added to the horizontal driver power supply unit, whereby the power terminals of the pseudo-horizontal drive circuits may be connected to the added power supplying terminals.

Figure 2:
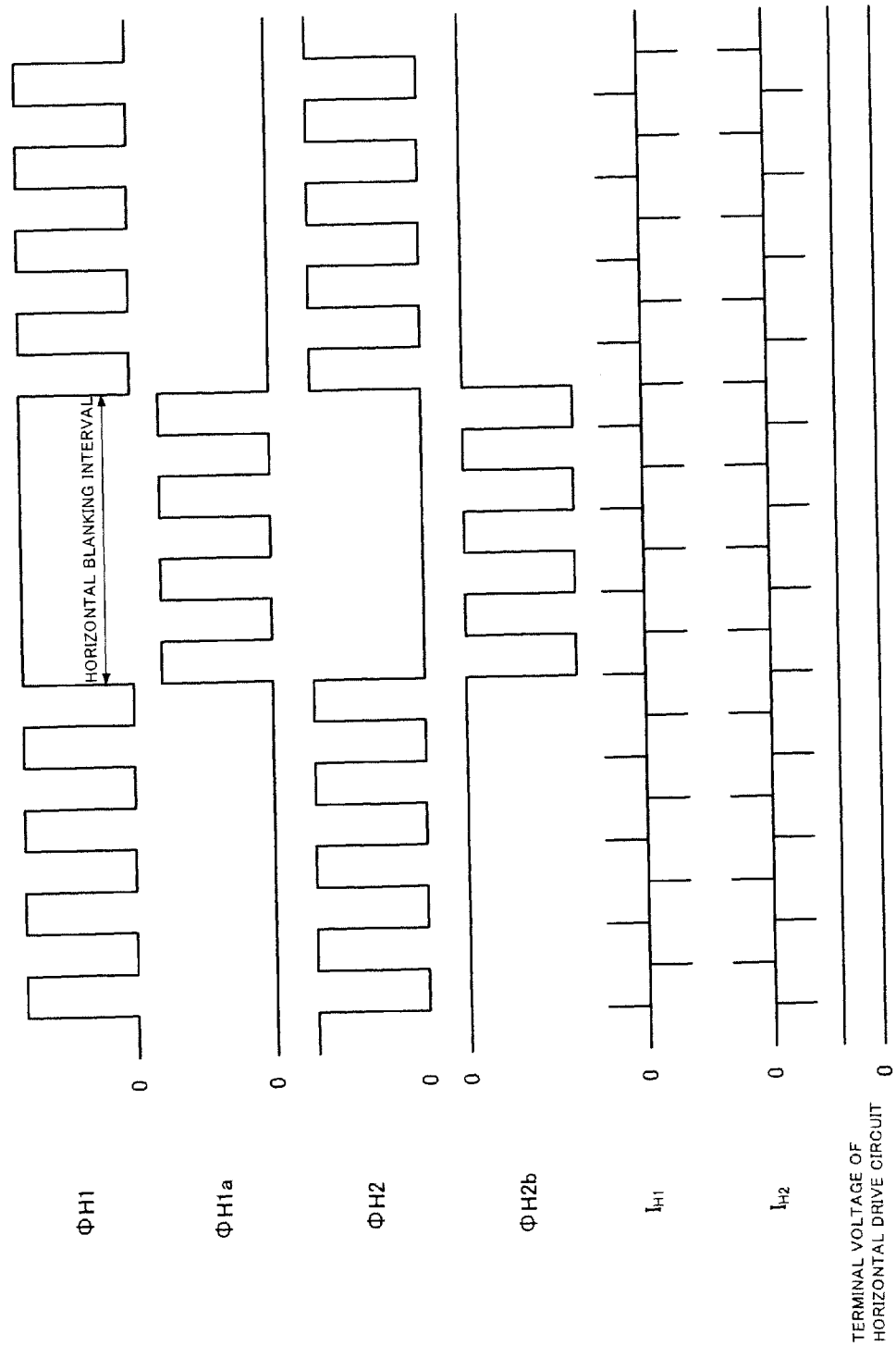
FIG. 2 is a diagram showing an example of respective signal waveforms of the solid state image sensor according to the first embodiment of the present invention.

FIG. 2 shows examples of signal waveforms of the horizontal drive pulses φH1 and φH2 generated by the first and second horizontal drive circuits 3 and 4, signal waveforms of the pseudo-horizontal drive pulses φH1a and φH2b generated by the first and second pseudo-horizontal drive circuits 6 and 7, signal waveforms of the currents IH1 and IH2 flowing from the horizontal driver power supply unit 2 to the first and second horizontal drive circuits 3 and 4 and to the first and second pseudo-horizontal drive circuits 6 and 7, and a waveform of a voltage (terminal voltage) applied to the power terminals of the first and second horizontal drive circuits 3 and 4.

As shown in FIG. 2, the horizontal drive pulses φH1 and φH2 are pulses that are in opposite phases to each other, and the pseudo-horizontal drive pulses φH1a and φH2b are also pulses that are in opposite phases to each other. In addition, the horizontal drive pulses φH1 and φH2 and the pseudo-horizontal drive pulses φH1a and φH2b have a low level of 0V and a high level of 3 to 5 V.

During a horizontal blanking interval, the horizontal drive pulse φH1 applied to the transfer electrodes 207 and 208 of the horizontal register shown in FIG. 22 is suspended in a high-level state and the horizontal drive pulse φH2 applied to the transfer electrodes 209 and 210 of the horizontal register shown in FIG. 22 is suspended in a low-level state. During the horizontal blanking interval, a signal charge existing in the final stage of the transfer channel 201 of the vertical register shown in FIG. 22 is transferred to under the transfer electrode 208 of the horizontal register shown in FIG. 22.

As shown in FIG. 2, while the pseudo-horizontal drive pulses φH1a and φH2b are generated during a horizontal blanking interval, since the pseudo-horizontal drive circuits are connected to the dummy load and the dummy load is connected to GND, the pseudo-horizontal drive pulses φH1a and φH2b are not applied to the transfer electrodes of the horizontal register. Therefore, a signal charge is prevented from being transferred through the horizontal register during a horizontal blanking interval.

After the horizontal blanking interval, the signal charge transferred to under the transfer electrode 208 of the horizontal register shown in FIG. 22 is transferred through the transfer channel 206 of the horizontal register shown in FIG. 22 by the horizontal drive pulses φH1 and φH2 in opposite phases to each other and is converted into a voltage signal at the charge detecting unit 105.

As shown, during a horizontal blanking interval in which a signal charge is transferred from the vertical register to the horizontal register, the horizontal drive pulses φH1 and φH2 are suspended while the pseudo-horizontal drive pulses φH1a and φH2b are pulses successive to the horizontal drive pulses φH1 and φH2. Therefore, during a horizontal blanking interval, while a current does not flow from the horizontal driver power supply unit 2 to the first and second horizontal drive circuits 3 and 4, a current flows to the first and second pseudo-horizontal drive circuits 6 and 7. The current that flows to the first and second pseudo-horizontal drive circuits 6 and 7 during the horizontal blanking interval becomes approximately equal to the currents IH1 and IH2 which flow to the first and second horizontal drive circuits 3 and 4 during an effective interval in which a signal charge is transferred from the horizontal register 104 to the charge detecting unit 105 by the horizontal drive pulses φH1 and φH2.

Therefore, according to the present first embodiment, the current generated at the horizontal driver power supply unit 2 can be arranged to be a constant current. Consequently, according to the present first embodiment, even when a reactance component exists on the power supply line to be connected to the horizontal driver power supply unit 2, it is possible to suppress power supply ripples immediately after the start of an effective interval and to suppress occurrences of image degradation such as shading or ringing in an image portion along the left edge of a screen.

Figure 3:
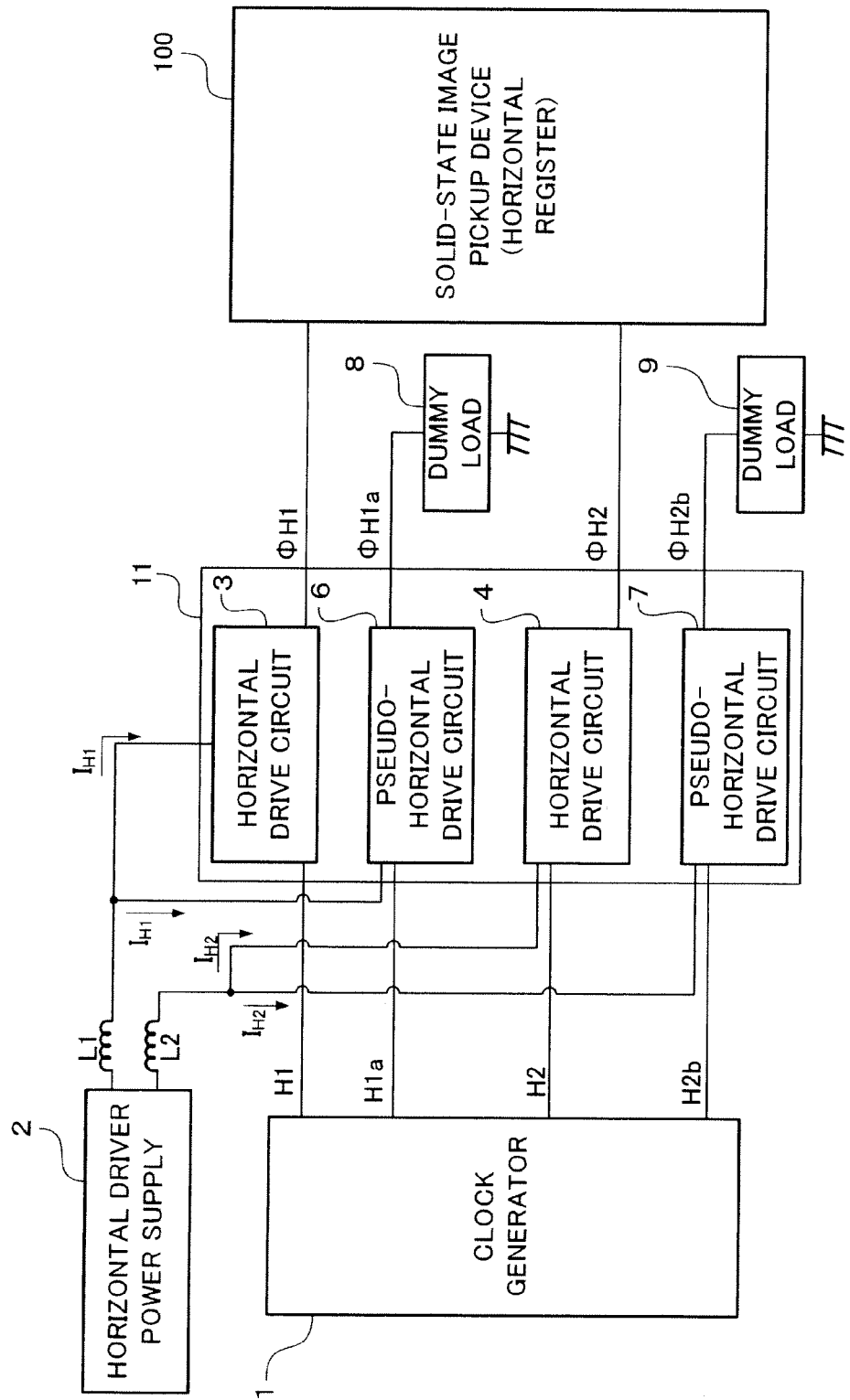
FIG. 3 is a block diagram partially showing a circuit of another example of the solid state image sensor according to the first embodiment of the present invention.

While a solid state image sensor in which horizontal drive circuits and pseudo-horizontal drive circuits are formed on different circuit boards has been described in the present first embodiment, as shown in FIG. 3, a configuration can also be adopted in which the horizontal drive circuits 3 and 4 and the pseudo-horizontal drive circuits 6 and 7 are formed on the same circuit board (the same chip) 11.

In the circuit shown in FIG. 1, since horizontal drive circuits and pseudo-horizontal circuits are formed on different circuit boards, the reactance component parasitic on a wire between the horizontal driver power supply unit 2 and the first horizontal drive circuit 3 actually differs from the reactance component parasitic on a wire between the horizontal driver power supply unit 2 and the first pseudo-horizontal drive circuit 6. In a similar manner, the reactance component parasitic on a wire between the horizontal driver power supply unit 2 and the second horizontal drive circuit 4 differs from the reactance component parasitic on a wire between the horizontal driver power supply unit 2 and the second pseudo-horizontal drive circuit 7. Therefore, with the circuit shown in FIG. 1, the current that flows to the pseudo-horizontal drive circuits during a horizontal blanking interval is not completely equal to the current that flows to the horizontal drive circuits during an effective interval.

In consideration thereof, as shown in FIG. 3, the current that flows to the pseudo-horizontal drive circuits during a horizontal blanking interval is equalized with the current that flows to the horizontal drive circuits during an effective interval using a chip on which horizontal drive circuits and pseudo-horizontal drive circuits are formed on the same board.

In other words, by using a chip on which horizontal drive circuits and pseudo-horizontal drive circuits are formed on the same board, the length of the wire (power supply line) between the horizontal driver power supply unit 2 and the first horizontal drive circuit 3 can be more equalized with the length of the wire (power supply line) between the horizontal driver power supply unit 2 and the first pseudo-horizontal drive circuit 6. As a result, the reactance component parasitic on the wire between the horizontal driver power supply unit 2 and the first horizontal drive circuit 3 can be more equalized with the reactance component parasitic on the wire between the horizontal driver power supply unit 2 and the first pseudo-horizontal drive circuit 6.

In a similar manner, the length of the wire (power supply line) between the horizontal driver power supply unit 2 and the second horizontal drive circuit 4 can be more equalized with the length of the wire (power supply line) between the horizontal driver power supply unit 2 and the second pseudo-horizontal drive circuit 7, thereby enabling the reactance component parasitic on the wire between the horizontal driver power supply unit 2 and the second horizontal drive circuit 4 to be more equalized with the reactance component parasitic on the wire between the horizontal driver power supply unit 2 and the second pseudo-horizontal drive circuit 7.

Accordingly, the current generated at the horizontal driver power supply unit during an effective interval and the current generated at the horizontal driver power supply unit during a horizontal blanking interval can be more equalized. As a result, it is possible to further suppress disturbances in the phases of horizontal drive pulses immediately after the start of the effective interval and to further suppress occurrences of image degradation such as shading or ringing in an image portion along the left edge of a screen.

Second Embodiment

A solid state image sensor according to a second embodiment of the present invention will now be described.

Figure 4:
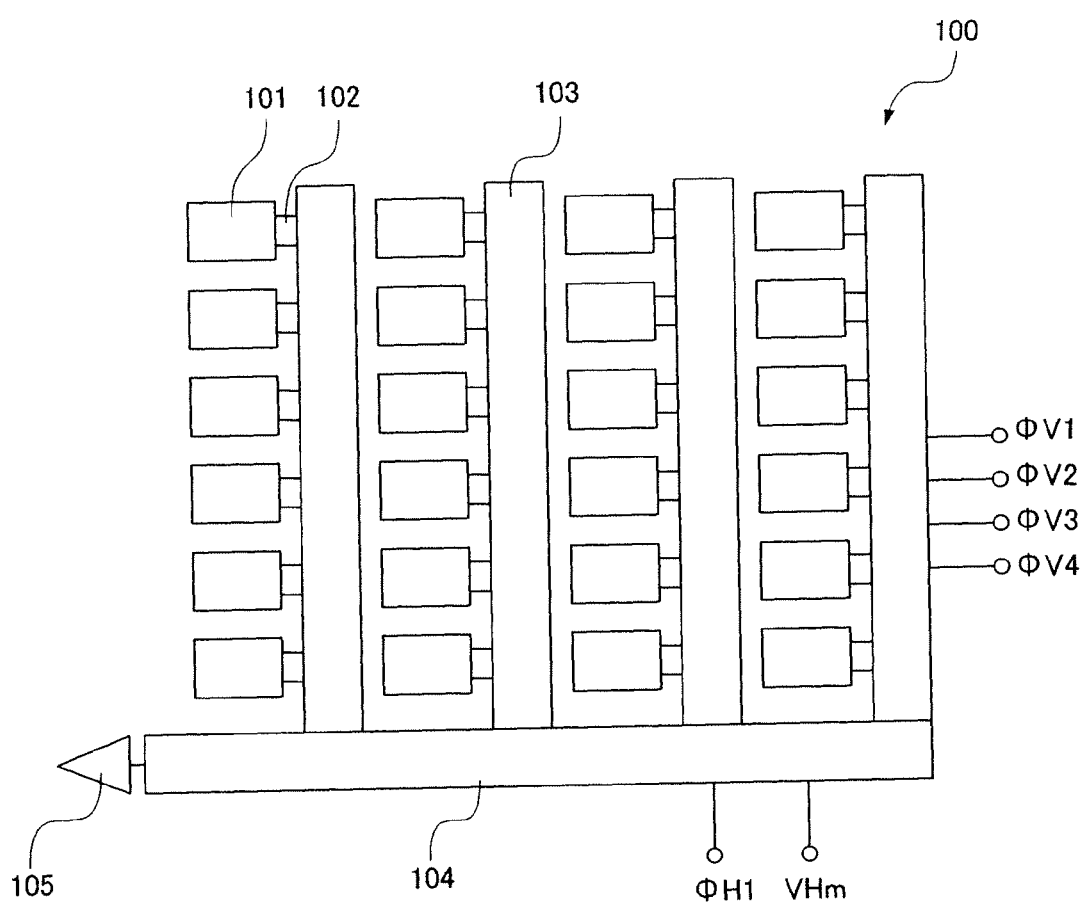
FIG. 4 is a diagram showing an example of the configuration of a solid-state image pickup device included in a solid state image sensor according to a second embodiment of the present invention.

FIG. 4 is a diagram showing an example of the configuration of a solid-state image pickup device included in the solid state image sensor according to the second embodiment of the present invention. The solid-state image pickup device 100 is of an interline transfer type and the configuration thereof is the same as the configuration of the conventional solid-state image pickup device shown in FIG. 20. However, the solid-state image pickup device 100 differs from the conventional device in that a horizontal register 104 is single-phase driven. In other words, in the present second embodiment, the horizontal register 104 is driven solely by a horizontal drive pulse φH1.

Figure 5:
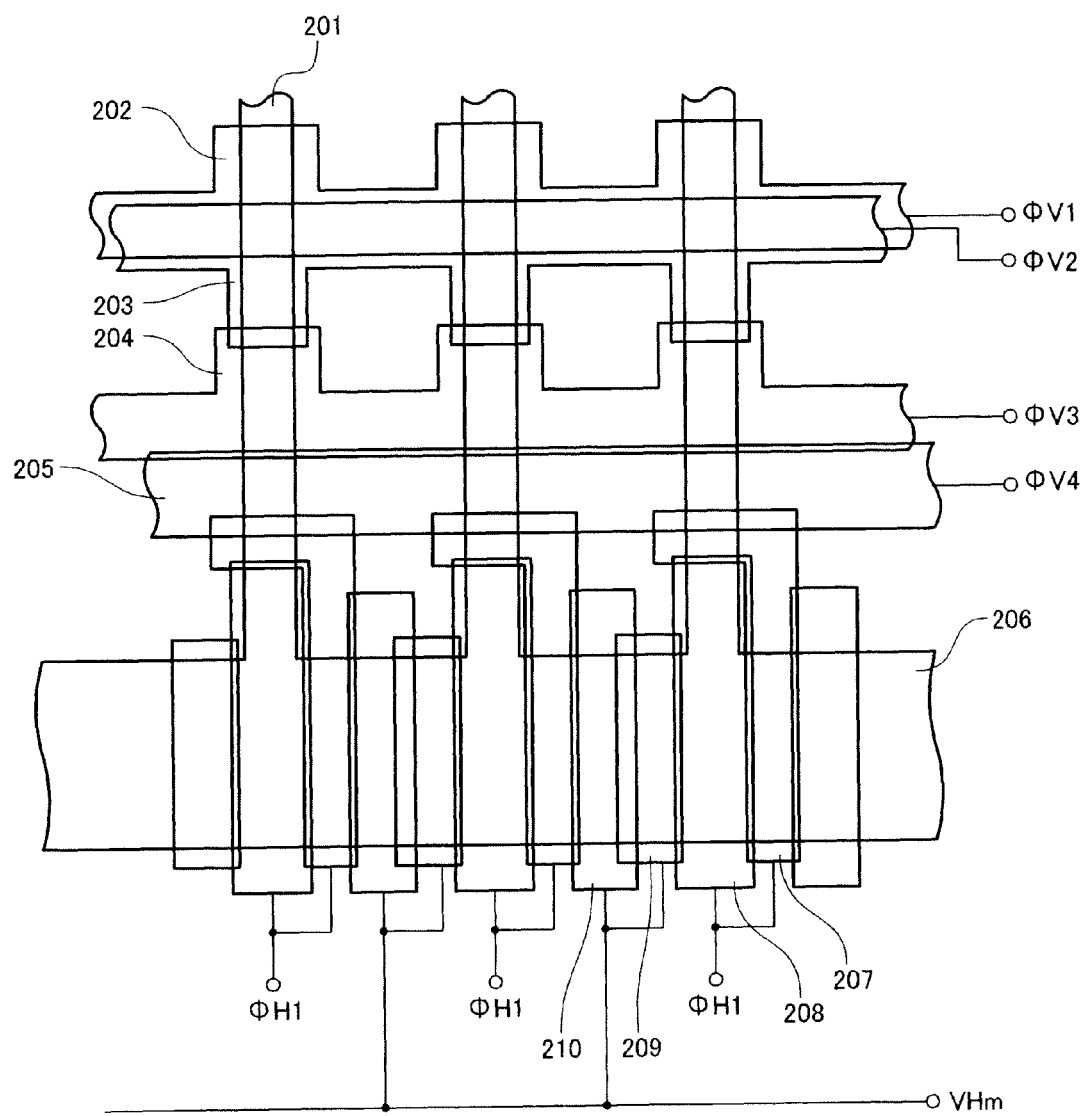
FIG. 5 is a plan view showing the configuration of the junction of a vertical register and a horizontal register of the solid state image sensor according to the second embodiment of the present invention.

FIG. 5 shows the configuration of the junction of a vertical register and a horizontal register of the solid state image sensor according to the second embodiment of the present invention. As shown in FIG. 5, the configuration of the junction of the vertical register and the horizontal register is similar to the configuration of the junction of the vertical register and the horizontal register of the conventional solid state image sensor shown in FIG. 22. However, the solid-state image pickup device 100 differs from the conventional device in that a fixed bias voltage VHm is now applied to transfer electrodes 209 and 210 of a horizontal register to which a horizontal drive pulse φH2 is applied in the conventional solid-state image pickup device. The voltage VHm represents a voltage approximately intermediate between the high level and the low level of the horizontal drive pulse φH1.

Figure 6:
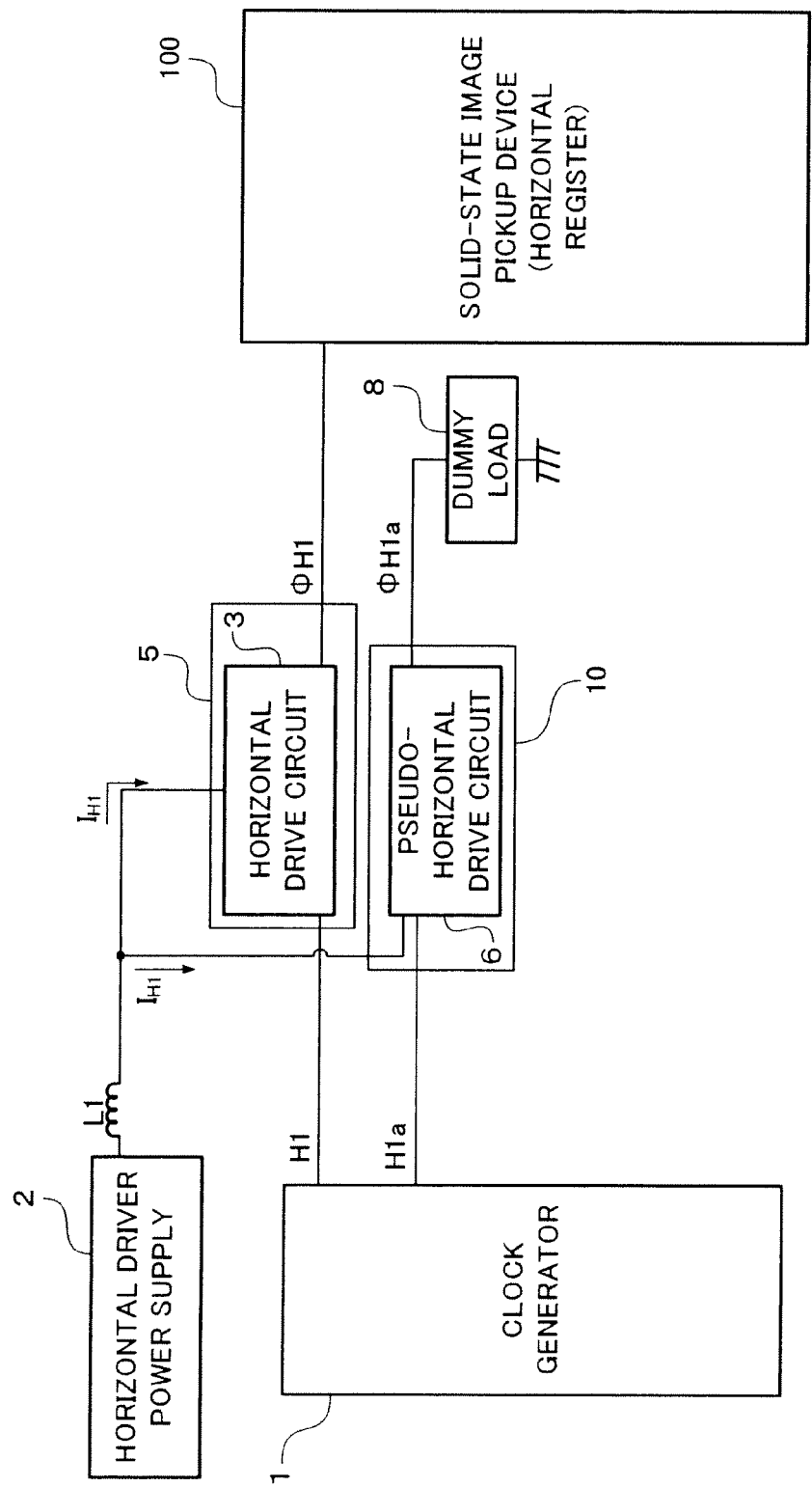
FIG. 6 is a block diagram partially showing a circuit of the solid state image sensor according to the second embodiment of the present invention.

FIG. 6 is a block diagram partially showing a circuit of the solid state image sensor according to the second embodiment of the present invention. Members corresponding to members described based on FIG. 21 mentioned earlier are assigned the same reference characters and detailed descriptions thereof shall be omitted.

As shown in FIG. 6, the solid state image sensor includes a clock generator 1, a horizontal driver power supply unit 2, a horizontal drive circuit 3, a pseudo-horizontal drive circuit 6, and a dummy load 8.

The clock generator 1 generates a clock pulse H1 and a clock pulse H1a respectively having a required period and a required amplitude.

Based on the clock pulse H1a, the pseudo-horizontal drive circuit 6 generates a pseudo-horizontal drive pulse φH1a that drives the dummy load 8.

The dummy load 8 is constituted by a capacitor having one end connected to an output terminal of the pseudo-horizontal drive circuit 6 and the other end connected to GND. In other words, in an interline transfer solid-state image pickup device, the structure of a transfer electrode of a horizontal register is equivalent to a capacitor structure. Accordingly, by configuring the dummy load 8 with a capacitor, an operating state of the solid state image sensor during a horizontal blanking interval can be approximated to an operating state during an effective interval.

In addition, the horizontal drive circuit 3 is formed on a circuit board (chip) 5 while the pseudo-horizontal drive circuit 6 is formed on a circuit board (chip) 10. As shown, in the present solid state image sensor, the horizontal drive circuit and the pseudo-horizontal drive circuit are formed on different circuit boards (different chips).

Additionally, in FIG. 6, reference character L1 denotes a reactance component parasitic on a wire (power supply line) connecting a power supplying terminal of the horizontal driver power supply unit 2 and power terminals of the horizontal drive circuit 3 and the pseudo-horizontal drive circuit 6. In this case, the reactance component parasitic on a wire between the horizontal driver power supply unit 2 and the horizontal drive circuit 3 is considered equal to the reactance component parasitic on a wire between the horizontal driver power supply unit 2 and the pseudo-horizontal drive circuit 6. Moreover, reference character IH1 denotes a current flowing from the horizontal driver power supply unit 2 to the horizontal drive circuit 3 and the pseudo-horizontal drive circuit 6. In this case, it is assumed that the horizontal driver power supply unit 2 is provided with a power supplying terminal corresponding to the horizontal drive circuit 3.

As described above, the solid state image sensor according to the present second embodiment includes, in addition to the horizontal drive circuit 3 which generates the horizontal drive pulse φH1, the pseudo-horizontal drive circuit 6 which generates the pseudo-horizontal drive pulse φH1a successive to the horizontal drive pulse φH1 during an interval in which the horizontal drive pulse φH1 is suspended (horizontal blanking interval), and is arranged so that the horizontal drive circuit 3 and the pseudo-horizontal drive circuit 6 are connected to the horizontal driver power supply unit 2.

According to this configuration, a current is generated at the horizontal driver power supply unit 2 during a horizontal blanking interval and the current generated at the horizontal driver power supply unit 2 becomes constant.

In addition, while the solid state image sensor is arranged so that the power terminal of the pseudo-horizontal drive circuit 6 is connected to the power supplying terminal of the horizontal driver power supply unit 2 that connects to the power terminal of the horizontal drive circuit 3, for example, a power supplying terminal for a pseudo-horizontal drive circuit may be added to the horizontal driver power supply unit, whereby the power terminal of the pseudo-horizontal drive circuit may be connected to the added power supplying terminal.

Figure 7:
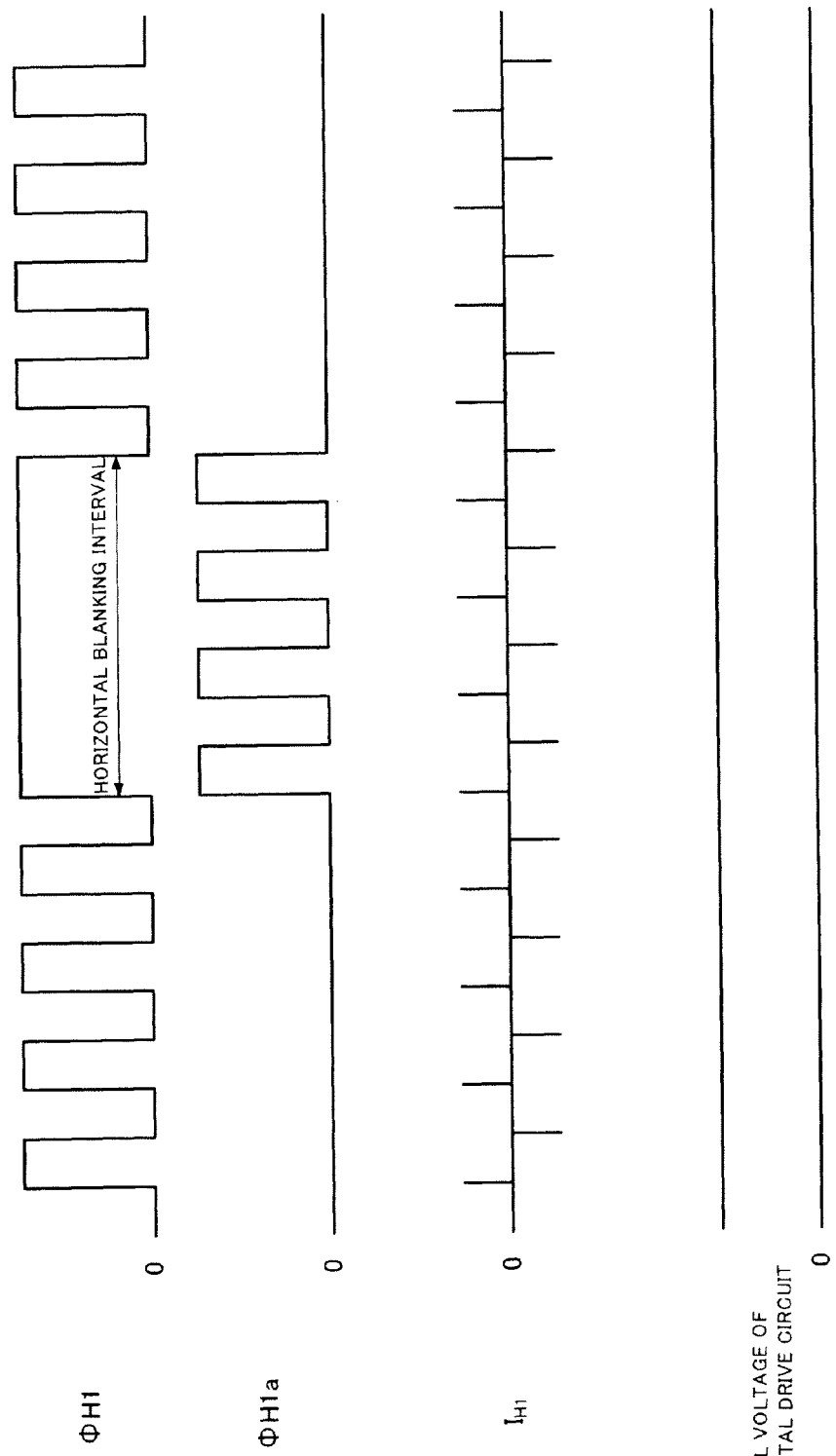
FIG. 7 is a diagram showing an example of respective signal waveforms of the solid state image sensor according to the second embodiment of the present invention.

FIG. 7 shows examples of a signal waveform of the horizontal drive pulse φH1 generated by the horizontal drive circuit 3, a signal waveform of the pseudo-horizontal drive pulse φH1a generated by the pseudo-horizontal drive circuit 6, a signal waveform of the current IH1 flowing from the horizontal driver power supply unit 2 to the horizontal drive circuit 3 and the pseudo-horizontal drive circuit 6, and a waveform of a voltage (terminal voltage) applied to the power terminal of the horizontal drive circuit 3. Moreover, the horizontal drive pulse φH1 and the pseudo-horizontal drive pulse φH1a have a low level of 0V and a high level of 3 to 5 V.

As shown in FIG. 7, during a horizontal blanking interval, the horizontal drive pulse φH1 applied to transfer electrodes 207 and 208 of the horizontal register shown in FIG. 5 is suspended in a high-level state. During the horizontal blanking interval, a signal charge existing in the final stage of a transfer channel 201 of the vertical register shown in FIG. 5 is transferred to under the transfer electrode 208 of the horizontal register shown in FIG. 5.

In addition, as shown in FIG. 7, while the pseudo-horizontal drive pulse φH1a is generated during a horizontal blanking interval, since the pseudo-horizontal drive circuit is connected to the dummy load and the dummy load is connected to GND, the pseudo-horizontal drive pulse φH1a is not applied to the transfer electrodes of the horizontal register. Therefore, a signal charge is prevented from being transferred through the horizontal register during a horizontal blanking interval.

After the horizontal blanking interval, the signal charge transferred to under the transfer electrode 208 of the horizontal register shown in FIG. 5 is transferred through the transfer channel 206 of the horizontal register shown in FIG. 5 by the horizontal drive pulse φH1 and is converted into a voltage signal at a charge detecting unit 105.

As shown, during a horizontal blanking interval in which a signal charge is transferred from the vertical register to the horizontal register, the horizontal drive pulse φH1 is suspended while the pseudo-horizontal drive pulse φH1a is a pulse successive to the horizontal drive pulse φH1. Therefore, during a horizontal blanking interval, while a current does not flow from the horizontal driver power supply unit 2 to the horizontal drive circuit 3, a current flows to the pseudo-horizontal drive circuit 6. The current that flows to the pseudo-horizontal drive circuit 6 during the horizontal blanking interval becomes approximately equal to the current IH1 which flows to the horizontal drive circuit 3 during an effective interval in which a signal charge is transferred from the horizontal register 104 to the charge detecting unit 105 by the horizontal drive pulse φH1.

Therefore, according to the present second embodiment, the current generated at the horizontal driver power supply unit 2 can be arranged to be a constant current. Consequently, according to the present second embodiment, even when a reactance component exists on the power supply line to be connected to the horizontal driver power supply unit 2, it is possible to suppress power supply ripples immediately after the start of an effective interval and to suppress occurrences of image degradation such as shading or ringing in an image portion along the left edge of a screen.

Figure 8:
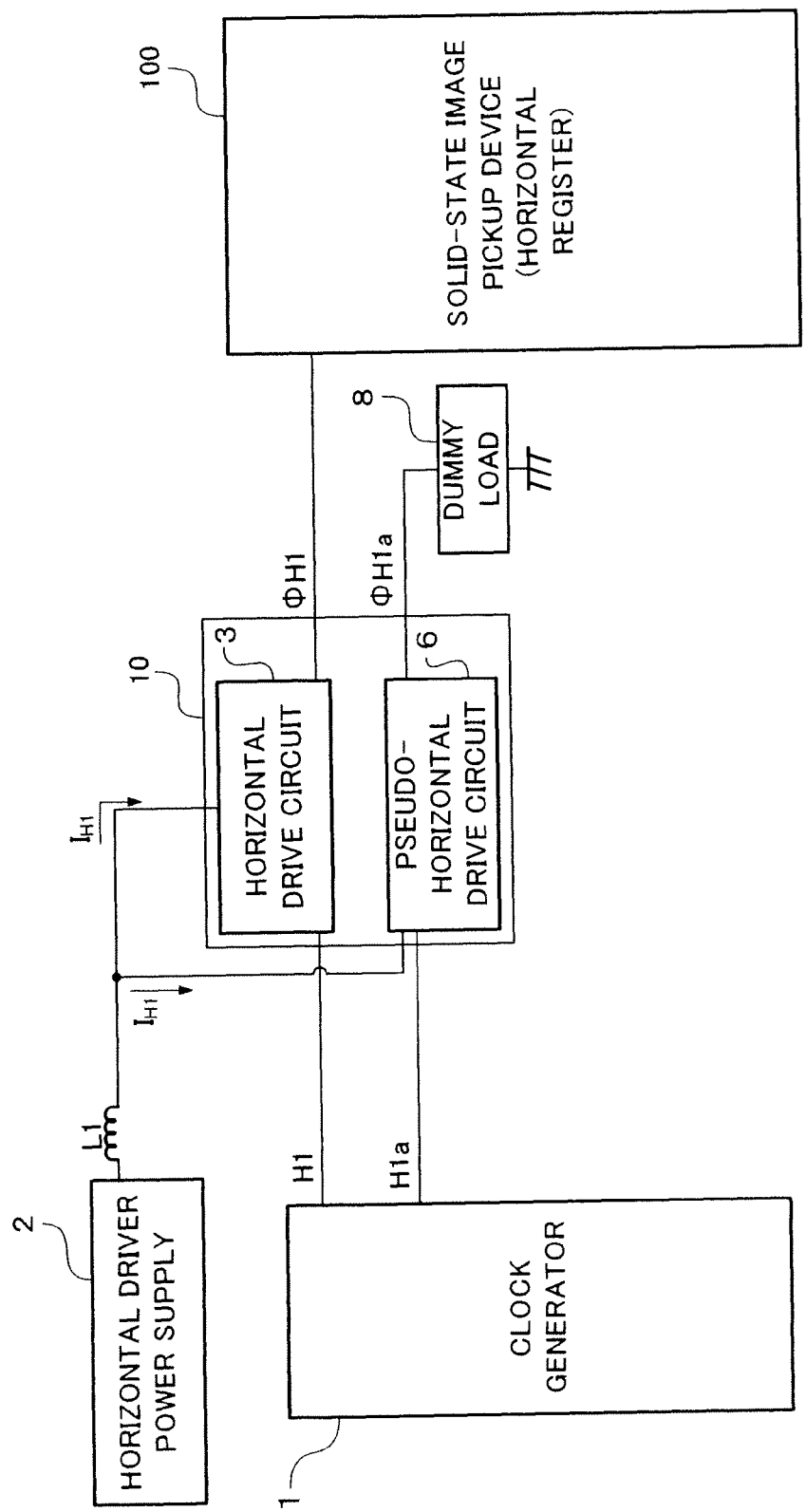
FIG. 8 is a block diagram partially showing a circuit of another example of the solid state image sensor according to the second embodiment of the present invention.

While a solid state image sensor in which a horizontal drive circuit and a pseudo-horizontal drive circuit are formed on different circuit boards has been described in the present second embodiment, as shown in FIG. 8, a configuration can also be adopted in which the horizontal drive circuit 3 and the pseudo-horizontal drive circuit 6 are formed on the same circuit board (the same chip) 11.

In the circuit shown in FIG. 6, since a horizontal drive circuit and a pseudo-horizontal circuit are formed on different circuit boards, the reactance component parasitic on a wire between the horizontal driver power supply unit 2 and the horizontal drive circuit 3 actually differs from the reactance component parasitic on a wire between the horizontal driver power supply unit 2 and the pseudo-horizontal drive circuit 6. Therefore, in the circuit shown in FIG. 6, the current that flows to the pseudo-horizontal drive circuit during a horizontal blanking interval is not completely equal to the current that flows to the horizontal drive circuit during an effective interval.

In consideration thereof, as shown in FIG. 8, the current that flows to the pseudo-horizontal drive circuit during a horizontal blanking interval is equalized with the current that flows to the horizontal drive circuit during an effective interval using a chip on which the horizontal drive circuit and the pseudo-horizontal drive circuit are formed on the same board.

In other words, by using a chip on which a horizontal drive circuit and a pseudo-horizontal drive circuit are formed on the same board, the length of the wire (power supply line) between the horizontal driver power supply unit 2 and the horizontal drive circuit 3 can be more equalized with the length of the wire (power supply line) between the horizontal driver power supply unit 2 and the pseudo-horizontal drive circuit 6. As a result, the reactance component parasitic on the wire between the horizontal driver power supply unit 2 and the horizontal drive circuit 3 can be more equalized with the reactance component parasitic on the wire between the horizontal driver power supply unit 2 and the pseudo-horizontal drive circuit 6.

Accordingly, the current generated at the horizontal driver power supply unit during an effective interval and the current generated at the horizontal driver power supply unit during a horizontal blanking interval can be more equalized. As a result, it is possible to further suppress disturbances in the phases of horizontal drive pulses immediately after the start of the effective interval and to further suppress occurrences of image degradation such as shading or ringing in an image portion along the left edge of a screen.

Third Embodiment

A solid state image sensor according to a third embodiment of the present invention will now be described.

A solid-state image pickup device included in the solid state image sensor is of an interline transfer type and the configuration thereof is the same as the configuration of the conventional solid-state image pickup device 100 shown in FIG. 20.

In addition, the configuration of the junction of a vertical register and a horizontal register in the present solid state image sensor is similar to the configuration of the junction of the vertical register and the horizontal register of the conventional solid state image sensor shown in FIG. 22.

Hereinafter, an example involving a four-phase drive vertical register and a two-phase drive horizontal register will be described. However, it should be noted that the present invention is not limited to a four-phase drive vertical register and a two-phase drive horizontal register.

Figure 9:
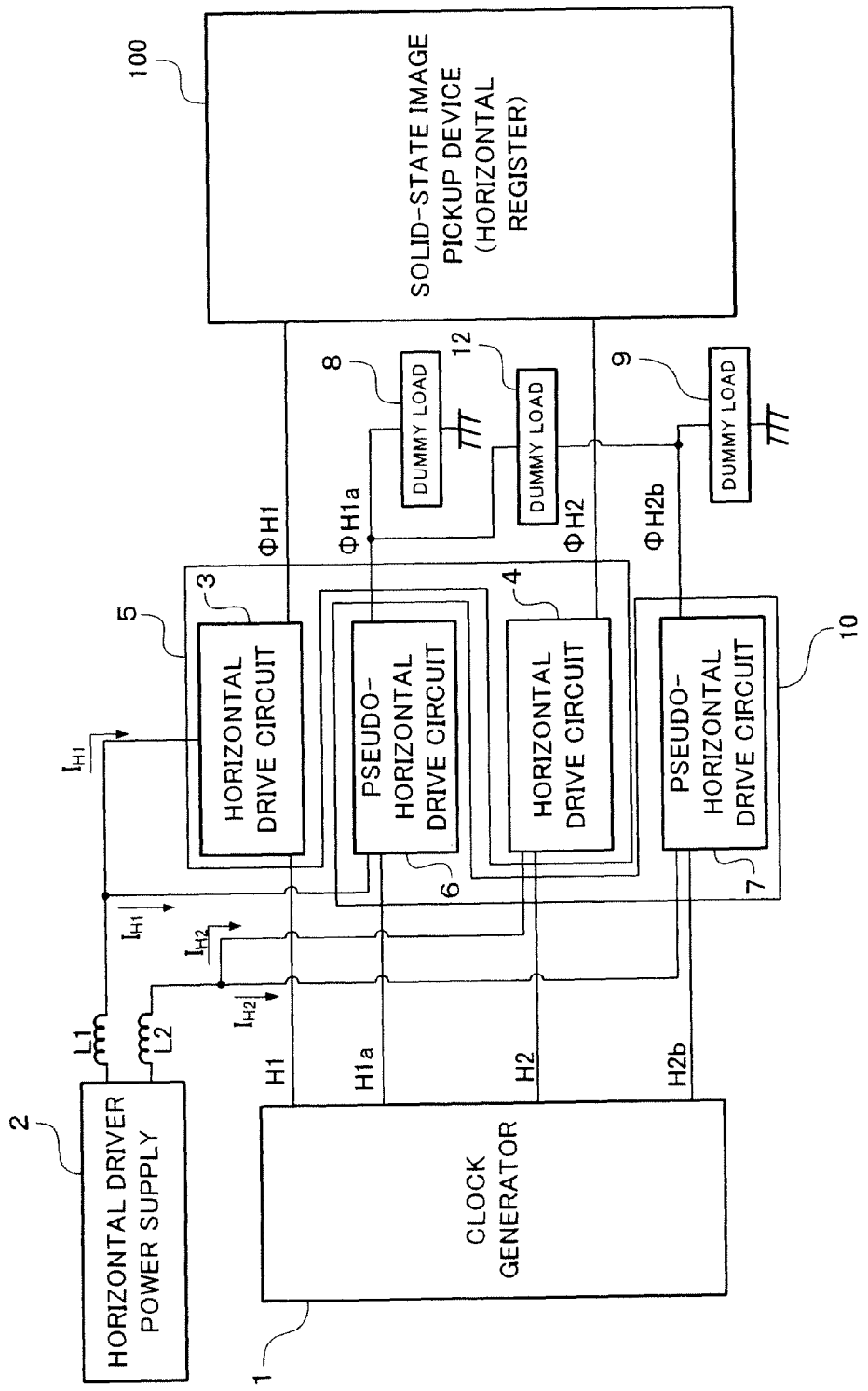
FIG. 9 is a block diagram partially showing a circuit of a solid state image sensor according to a third embodiment of the present invention.

FIG. 9 is a block diagram partially showing a circuit of the solid state image sensor according to the present third embodiment. Members corresponding to members described based on FIG. 21 mentioned earlier are assigned the same reference characters and detailed descriptions thereof shall be omitted.

As shown in FIG. 9, the solid state image sensor further includes a first pseudo-horizontal drive circuit 6, a second pseudo-horizontal drive circuit 7, a first dummy load 8, a second dummy load 9, and a third dummy load 12. Furthermore, a clock generator 1 generates, in addition to clock pulses H1 and H2, clock pulses H1a and H2b having a required period and a required amplitude.

Based on the clock pulse H1a, the first pseudo-horizontal drive circuit 6 generates a pseudo-horizontal drive pulse φH1a that drives the first and third dummy loads 8 and 12. In addition, based on the clock pulse H2b, the second pseudo-horizontal drive circuit 7 generates a pseudo-horizontal drive pulse φH2b that drives the second and third dummy loads 9 and 12. In this manner, the third dummy load 12 is driven by the pseudo-horizontal drive circuits 6 and 7.

More specifically, the first and second dummy loads 8 and 9 are constituted by capacitors having one ends of their ends connected to output terminals of the pseudo-horizontal drive circuits 6 and 7 and the other ends connected to GND. In addition, the third dummy load 12 is constituted by a capacitor having one end connected to an output terminal of the first pseudo-horizontal drive circuit 6 and the other end connected to an output terminal of the second pseudo-horizontal drive circuit 7.

Furthermore, two horizontal drive circuits 3 and 4 are formed on the same circuit board (the same chip) 5 and the two pseudo-horizontal drive circuits 6 and 7 are formed on the same circuit board (the same chip) 10. As shown, in the present solid state image sensor, the horizontal drive circuits and the pseudo-horizontal drive circuits are formed on different circuit boards (different chips).

Furthermore, in FIG. 9, reference character L1 denotes a reactance component parasitic on a wire (power supply line) connecting a power supplying terminal of a horizontal driver power supply unit 2 and power terminals of the first horizontal drive circuit 3 and the first pseudo-horizontal drive circuit 6. In this case, a reactance component parasitic on a wire between the horizontal driver power supply unit 2 and the first horizontal drive circuit 3 is considered equal to a reactance component parasitic on a wire between the horizontal driver power supply unit 2 and the first pseudo-horizontal drive circuit 6.

In addition, reference character L2 denotes a reactance component parasitic on a wire (power supply line) connecting the power supplying terminal of the horizontal driver power supply unit 2 and power terminals of the second horizontal drive circuit 4 and the second pseudo-horizontal drive circuit 7. In this case, a reactance component parasitic on a wire between the horizontal driver power supply unit 2 and the second horizontal drive circuit 4 is considered equal to a reactance component parasitic on a wire between the horizontal driver power supply unit 2 and the second pseudo-horizontal drive circuit 7.

Furthermore, reference character IH1 denotes a current flowing from the horizontal driver power supply unit 2 to the first horizontal drive circuit 3 and the first pseudo-horizontal drive circuit 6, while IH2 denotes a current flowing from the horizontal driver power supply unit 2 to the second horizontal drive circuit 4 and the second pseudo-horizontal drive circuit 7.

In this case, it is assumed that the horizontal driver power supply unit 2 is provided with power supplying terminals respectively corresponding to the first and second horizontal drive circuits 3 and 4.

Figure 10:
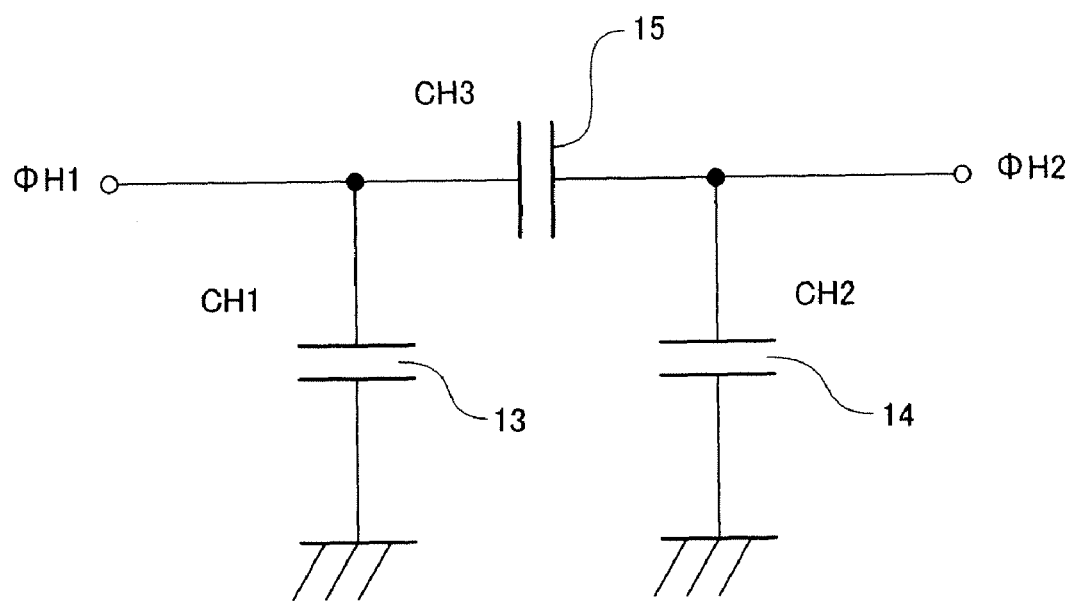
FIG. 10 is a diagram showing an equivalent circuit of a transfer electrode of a horizontal register of the solid state image sensor according to the third embodiment of the present invention.

FIG. 10 shows an equivalent circuit of a transfer electrode of the horizontal register. The structure of the transfer electrode of the horizontal register is equivalent to a capacitor structure in which, besides a capacitor 13 between a horizontal drive pulse φH1 and GND and a capacitor 14 between a horizontal drive pulse φH2 and GND, a capacitor 15 exists between the horizontal drive pulse φH1 and the horizontal drive pulse φH2.

Thus, by configuring the first dummy load 8 with a capacitor having the same capacity CH1 as the capacitor 13, the second dummy load 9 with a capacitor having the same capacity CH2 as the capacitor 14, and the third dummy load 12 with a capacitor having the same capacity CH3 as the capacitor 15, an operational state of the solid state image sensor during a horizontal blanking interval can be further approximated to an operational state during an effective interval.

As described above, the solid state image sensor according to the present third embodiment includes, in addition to the horizontal drive circuits 3 and 4 which generate the horizontal drive pulses φH1 and φH2, the pseudo-horizontal drive circuits 6 and 7 which generate the pseudo-horizontal drive pulses φH1a and φH2b successive to the horizontal drive pulses φH1 and φH2 during an interval in which the horizontal drive pulses φH1 and φH2 are suspended (horizontal blanking interval), and is arranged so that the horizontal drive circuits 3 and 4 and the pseudo-horizontal drive circuits 6 and 7 are connected to the horizontal driver power supply unit 2.

According to this configuration, a current is generated at the horizontal driver power supply unit 2 during a horizontal blanking interval and the current generated at the horizontal driver power supply unit 2 becomes constant.

In addition, the solid state image sensor is arranged so that the power terminal of the first pseudo-horizontal drive circuit 6 is connected to the power supplying terminal of the horizontal driver power supply unit 2 that connects to the power terminal of the first horizontal drive circuit 3 and the power terminal of the second pseudo-horizontal drive circuit 7 is connected to the power supplying terminal of the horizontal driver power supply unit 2 that connects to the power terminal of the second horizontal drive circuit 4. However, for example, power supplying terminals for pseudo-horizontal drive circuits may be added to the horizontal driver power supply unit, whereby the power terminals of the pseudo-horizontal drive circuits may be connected to the added power supplying terminals.

Moreover, signal waveforms of the horizontal drive pulses φH1 and φH2 generated by the first and second horizontal drive circuits 3 and 4, signal waveforms of the pseudo-horizontal drive pulses φH1a and φH2b generated by the first and second pseudo-horizontal drive circuits 6 and 7, signal waveforms of the currents IH1 and IH2 flowing from the horizontal driver power supply unit 2 to the first and second horizontal drive circuits 3 and 4 and to the first and second pseudo-horizontal drive circuits 6 and 7, and waveforms of a voltage (terminal voltage) applied to the power terminals of the first and second horizontal drive circuits 3 and 4 are similar to the waveforms described earlier in the first embodiment (refer to FIG. 2).

In other words, during a horizontal blanking interval in which a signal charge is transferred from the vertical register to the horizontal register, the horizontal drive pulses φH1 and φH2 are suspended while the pseudo-horizontal drive pulses φH1a and φH2b are pulses successive to the horizontal drive pulses φH1 and φH2. Therefore, during a horizontal blanking interval, while a current does not flow from the horizontal driver power supply unit 2 to the first and second horizontal drive circuits 3 and 4, a current flows to the first and second pseudo-horizontal drive circuits 6 and 7. The current that flows to the first and second pseudo-horizontal drive circuits 6 and 7 during the horizontal blanking interval becomes approximately equal to the currents IH1 and IH2 which flow to the first and second horizontal drive circuits 3 and 4 during an effective interval in which a signal charge is transferred from a horizontal register 104 to a charge detecting unit 105 by the horizontal drive pulses φH1 and φH2.

Therefore, according to the present third embodiment, the current generated at the horizontal driver power supply unit 2 can be arranged to be a constant current. Consequently, according to the present third embodiment, even when a reactance component exists on the power supply line to be connected to the horizontal driver power supply unit 2, it is possible to suppress power supply ripples immediately after the start of an effective interval and to suppress occurrences of image degradation such as shading or ringing in an image portion along the left edge of a screen.

Figure 11:
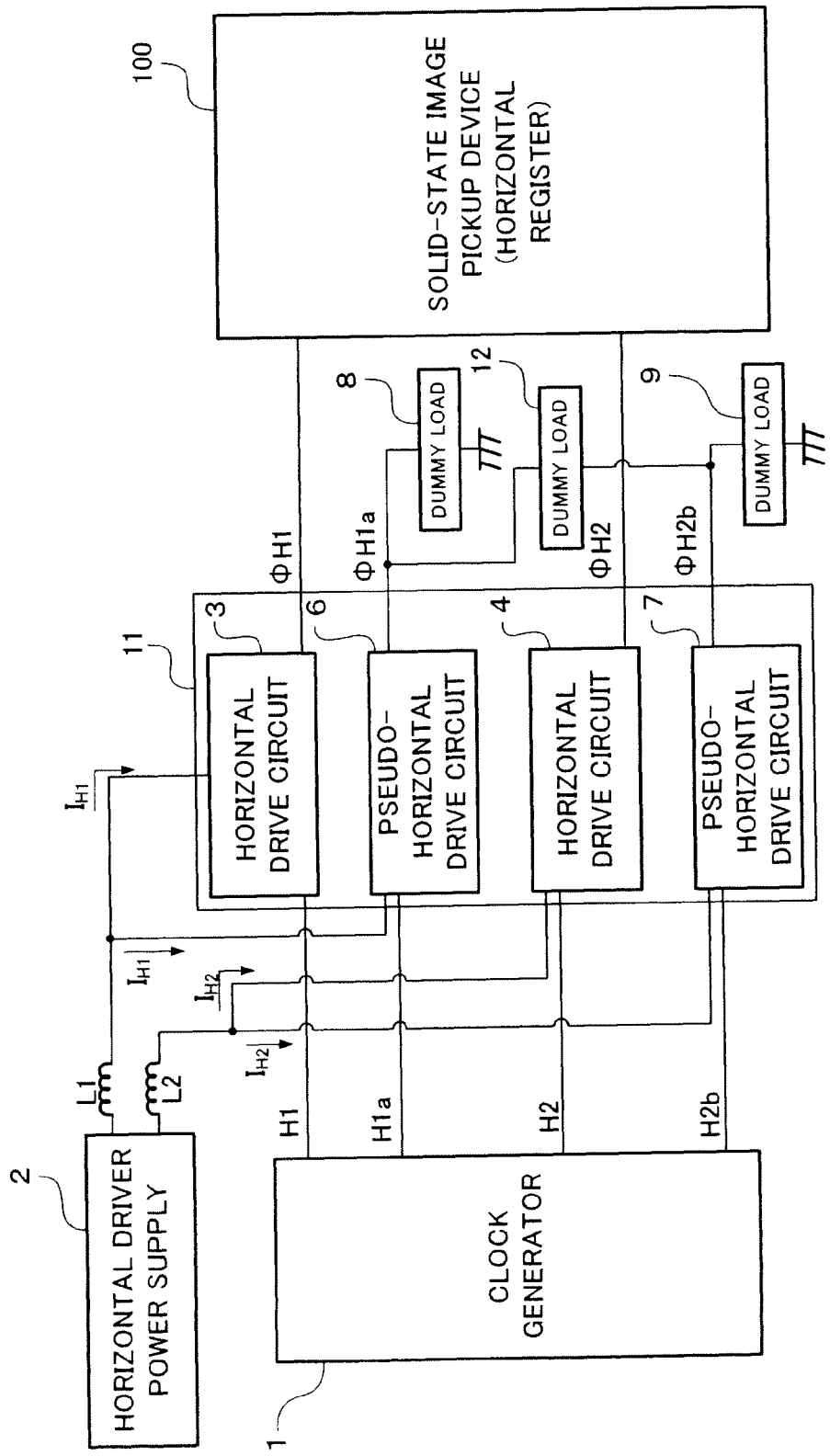
FIG. 11 is a block diagram partially showing a circuit of another example of the solid state image sensor according to the third embodiment of the present invention.

While a solid state image sensor in which horizontal drive circuits and pseudo-horizontal drive circuits are formed on different circuit boards has been described in the present third embodiment, as shown in FIG. 11, a configuration can also be adopted in which the horizontal drive circuits 3 and 4 and the pseudo-horizontal drive circuits 6 and 7 are formed on the same circuit board (the same chip) 11.

In the circuit shown in FIG. 9, since horizontal drive circuits and pseudo-horizontal circuits are formed on different circuit boards, the reactance component parasitic on a wire between the horizontal driver power supply unit 2 and the first horizontal drive circuit 3 actually differs from the reactance component parasitic on a wire between the horizontal driver power supply unit 2 and the first pseudo-horizontal drive circuit 6. In a similar manner, the reactance component parasitic on a wire between the horizontal driver power supply unit 2 and the second horizontal drive circuit 4 differs from the reactance component parasitic on a wire between the horizontal driver power supply unit 2 and the second pseudo-horizontal drive circuit 7. Therefore, in the circuit shown in FIG. 9, the current that flows to a pseudo-horizontal drive circuit during a horizontal blanking interval is not completely equal to the current that flows to a horizontal drive circuit during an effective interval.

In consideration thereof, as shown in FIG. 11, the current that flows to a pseudo-horizontal drive circuit during a horizontal blanking interval is equalized with the current that flows to a horizontal drive circuit during an effective interval using a chip on which the horizontal drive circuit and the pseudo-horizontal drive circuit are formed on the same board.

In other words, by using a chip on which horizontal drive circuits and pseudo-horizontal drive circuits are formed on the same board, the length of the wire (power supply line) between the horizontal driver power supply unit 2 and the first horizontal drive circuit 3 can be more equalized with the length of the wire (power supply line) between the horizontal driver power supply unit 2 and the first pseudo-horizontal drive circuit 6. As a result, the reactance component parasitic on the wire between the horizontal driver power supply unit 2 and the first horizontal drive circuit 3 can be more equalized with the reactance component parasitic on the wire between the horizontal driver power supply unit 2 and the first pseudo-horizontal drive circuit 6.

In a similar manner, the length of the wire (power supply line) between the horizontal driver power supply unit 2 and the second horizontal drive circuit 4 can be more equalized with the length of the wire (power supply line) between the horizontal driver power supply unit 2 and the second pseudo-horizontal drive circuit 7, thereby enabling the reactance component parasitic on the wire between the horizontal driver power supply unit 2 and the second horizontal drive circuit 4 to be more equalized with the reactance component parasitic on the wire between the horizontal driver power supply unit 2 and the second pseudo-horizontal drive circuit 7.

Accordingly, the current generated at the horizontal driver power supply unit during an effective interval and the current generated at the horizontal driver power supply unit during a horizontal blanking interval can be more equalized. As a result, it is possible to further suppress disturbances in the phases of horizontal drive pulses immediately after the start of the effective interval and to further suppress occurrences of image degradation such as shading or ringing in an image portion along the left edge of a screen.

Fourth Embodiment

While solid state image sensors provided with the same number of pseudo-horizontal drive circuits as the number of horizontal drive circuits have been described above in the first to third embodiments, a solid state image sensor according to the present invention may be configured so that, for example, two horizontal drive circuits and one pseudo-horizontal drive circuit are provided.

Figure 12:
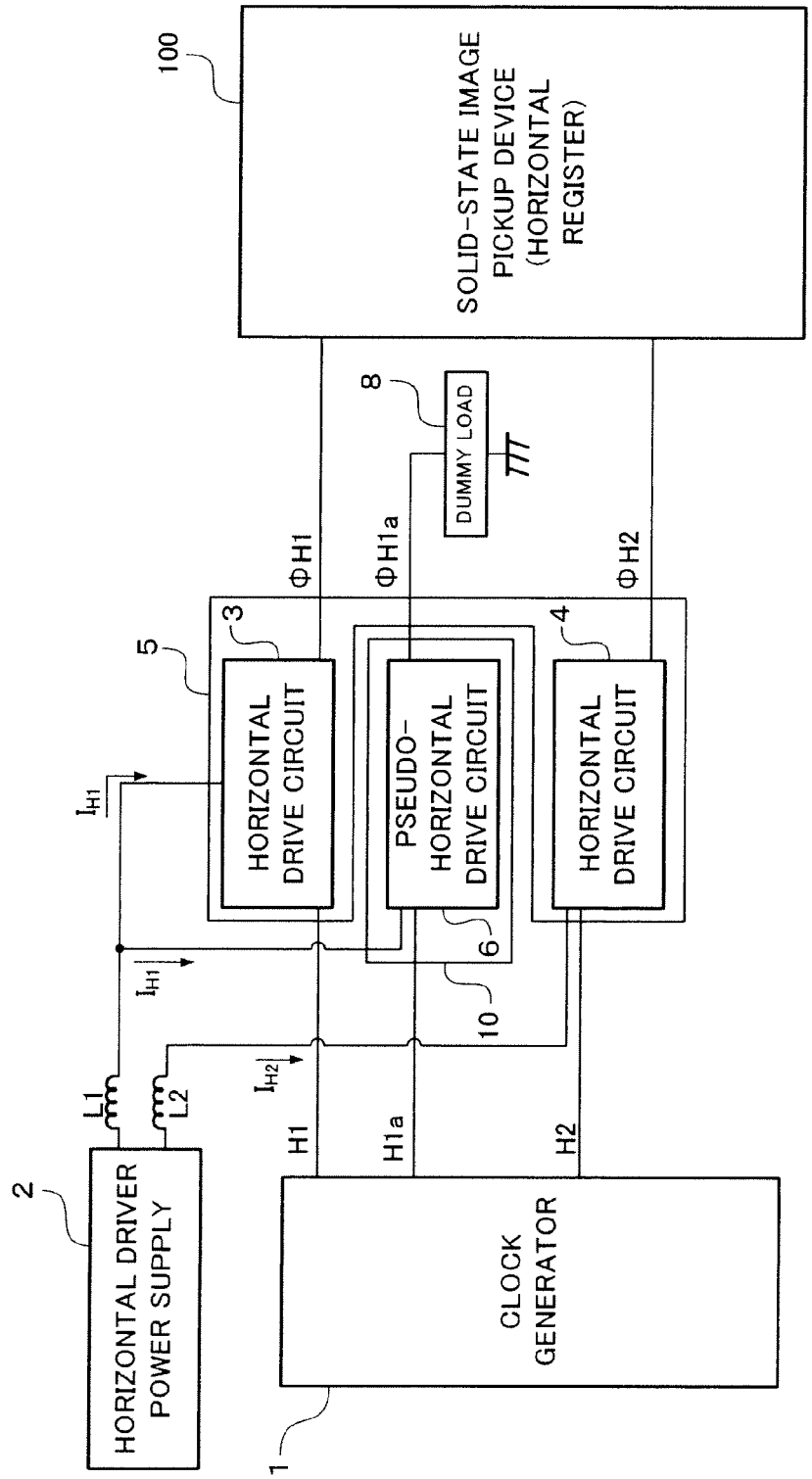
FIG. 12 is a block diagram partially showing a circuit of a solid state image sensor according to a fourth embodiment of the present invention.

FIG. 12 shows a portion of a circuit of a solid state image sensor according to the present fourth embodiment. Members corresponding to members described based on FIG. 21 mentioned earlier are assigned the same reference characters and detailed descriptions thereof shall be omitted.

A solid-state image pickup device 100 included in the solid state image sensor is of an interline transfer type and the configuration thereof is the same as the configuration of the conventional solid-state image pickup device shown in FIG. 20. In addition, the configuration of the junction of a vertical register and a horizontal register in the present solid state image sensor is similar to the configuration of the junction of the vertical register and the horizontal register of the conventional solid state image sensor shown in FIG. 22.

Hereinafter, an example involving a four-phase drive vertical register and a two-phase drive horizontal register will be described. However, it should be noted that the present invention is not limited to a four-phase drive vertical register and a two-phase drive horizontal register.

As shown in FIG. 12, the solid state image sensor further includes a pseudo-horizontal drive circuit 6 and a dummy load 8. Furthermore, a clock generator 1 generates, in addition to clock pulses H1 and H2, a clock pulse H1$a$ having a required period and a required amplitude.

Based on the clock pulse H1$a$, the pseudo-horizontal drive circuit 6 generates a pseudo-horizontal drive pulse $\phi$H1$a$ that drives the dummy load 8.

The dummy load 8 is constituted by a capacitor having one end connected to an output terminal of the pseudo-horizontal drive circuit 6 and the other end connected to GND. In other words, in an interline transfer solid-state image pickup device, the structure of a transfer electrode of a horizontal register is equivalent to a capacitor structure. Accordingly, by configuring the dummy load 8 with a capacitor, an operating state of the solid state image sensor during a horizontal blanking interval can be approximated to an operating state during an effective interval.

Furthermore, two horizontal drive circuits 3 and 4 are formed on the same circuit board (the same chip) 5 and the pseudo-horizontal drive circuit 6 is formed on a circuit board (the same chip) 10 that differs from the circuit board 5. As shown, in the present solid state image sensor, the horizontal drive circuits and the pseudo-horizontal drive circuit are formed on different circuit boards (different chips).

Additionally, in FIG. 12, reference character L1 denotes a reactance component parasitic on a wire (power supply line) connecting a power supplying terminal of a horizontal driver power supply unit 2 and power terminals of the first horizontal drive circuit 3 and the pseudo-horizontal drive circuit 6. In this case, the reactance component parasitic on a wire between the horizontal driver power supply unit 2 and the first horizontal drive circuit 3 is considered equal to the reactance component parasitic on a wire between the horizontal driver power supply unit 2 and the pseudo-horizontal drive circuit 6. Furthermore, reference character L2 denotes a reactance component parasitic on a wire (power supply line) connecting the power supplying terminal of the horizontal driver power supply unit 2 and a power terminal of the second horizontal drive circuit 4.

Moreover, reference character IH1 denotes a current flowing from the horizontal driver power supply unit 2 to the first horizontal drive circuit 3 and the pseudo-horizontal drive circuit 6, while IH2 denotes a current flowing from the horizontal driver power supply unit 2 to the second horizontal drive circuit 4.

In this case, it is assumed that the horizontal driver power supply unit 2 is provided with power supplying terminals respectively corresponding to the first and second horizontal drive circuits 3 and 4.

In addition, in the present solid state image sensor, a current flowing through the pseudo-horizontal drive circuit 6 is approximately double the current flowing through the pseudo-horizontal drive circuit 6 in the first embodiment described earlier. In consideration thereof, in order to create a similar state to the pseudo-horizontal drive circuit 6 in the first embodiment, the capacity of the dummy load 3 is approximately doubled in the present second embodiment.

As described above, the solid state image sensor according to the present fourth embodiment includes, in addition to the horizontal drive circuits 3 and 4 which generate horizontal drive pulses $\phi$H1 and $\phi$H2, the pseudo-horizontal drive circuit 6 which generates the pseudo-horizontal drive pulse $\phi$H1$a$ successive to the horizontal drive pulse $\phi$H1 during an interval in which the horizontal drive pulses $\phi$H1 and $\phi$H2 are suspended (horizontal blanking interval), and is arranged so that the horizontal drive circuits 3 and 4 and the pseudo-horizontal drive circuit 6 are connected to the horizontal driver power supply unit 2.

According to this configuration, a current is generated at the horizontal driver power supply unit 2 during a horizontal blanking interval and the current generated at the horizontal driver power supply unit 2 becomes constant.

In addition, while the solid state image sensor is arranged so that the power terminal of the pseudo-horizontal drive circuit 6 is connected to the power supplying terminal of the horizontal driver power supply unit 2 that connects to the power terminal of the first horizontal drive circuit 3, for example, a power supplying terminal for a pseudo-horizontal drive circuit may be added to the horizontal driver power supply unit, whereby the power terminal of the pseudo-horizontal drive circuit may be connected to the added power supplying terminal.

Figure 13:
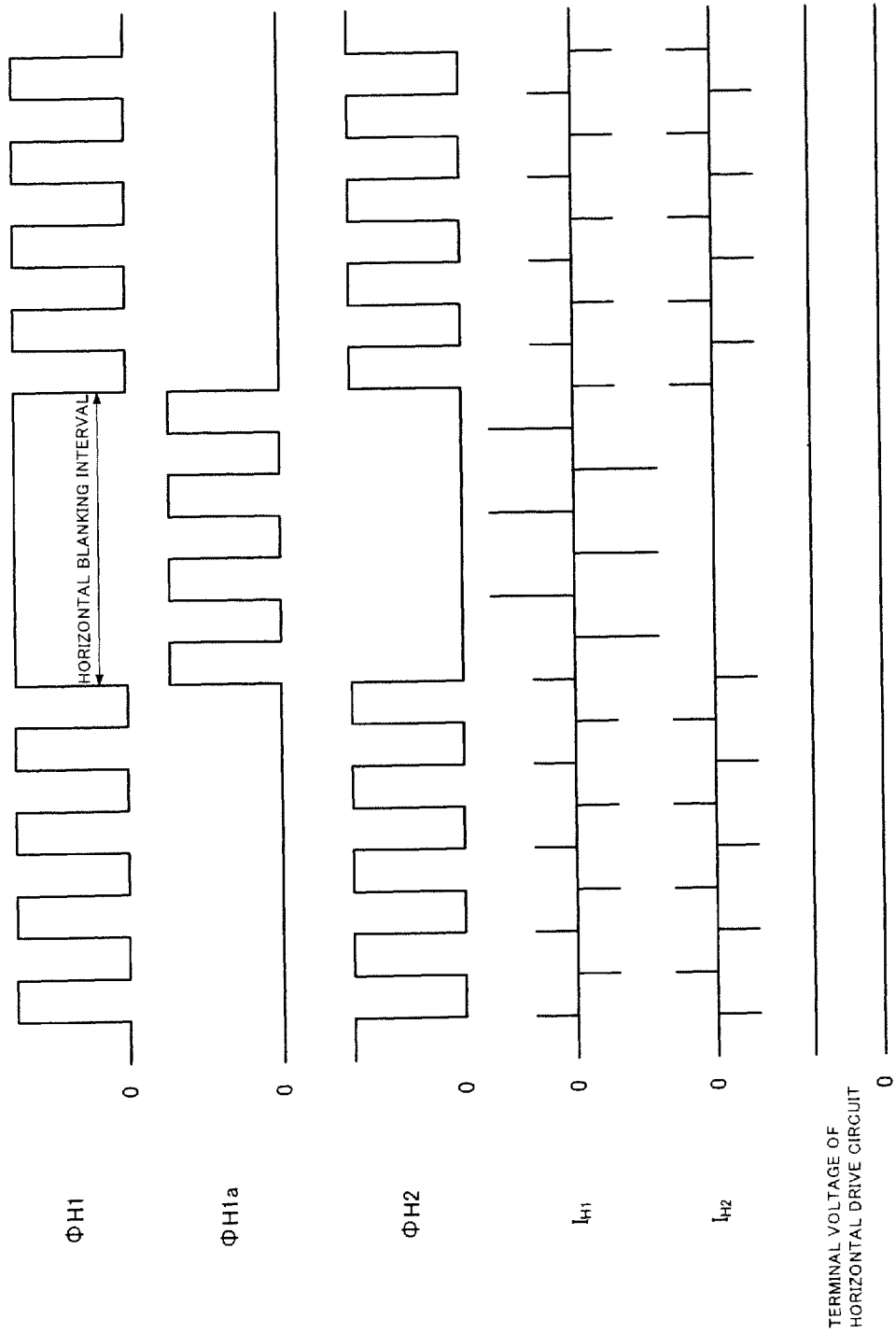
FIG. 13 is a diagram showing an example of respective signal waveforms of the solid state image sensor according to the fourth embodiment of the present invention.

FIG. 13 shows examples of signal waveforms of the horizontal drive pulses $\phi$H1 and $\phi$H2 generated by the first and second horizontal drive circuits 3 and 4, a signal waveform of the pseudo-horizontal drive pulse $\phi$H1$a$ generated by the pseudo-horizontal drive circuit 6, a signal waveform of the current IH1 flowing from the horizontal driver power supply unit 2 to the first horizontal drive circuit 3 and to the pseudo-horizontal drive circuit 6, a signal waveform of the current IH2 flowing from the horizontal driver power supply unit 2 to the second horizontal drive circuit 4 and a waveform of a voltage (terminal voltage) applied to the power terminals of the first and second horizontal drive circuits 3 and 4.

As shown in FIG. 13, the horizontal drive pulses $\phi$H1 and $\phi$H2 are pulses that are in opposite phases to each other.

Moreover, the horizontal drive pulses φH1 and φH2 and the pseudo-horizontal drive pulse φH1a have a low level of 0V and a high level of 3 to 5 V.

During a horizontal blanking interval, the horizontal drive pulse φH1 applied to the transfer electrodes 207 and 208 of the horizontal register shown in FIG. 22 is suspended in a high-level state and the horizontal drive pulse φH2 applied to the transfer electrodes 209 and 210 of the horizontal register shown in FIG. 22 is suspended in a low-level state. During the horizontal blanking interval, a signal charge existing in the final stage of the transfer channel 201 of the vertical register shown in FIG. 22 is transferred to under the transfer electrode 208 of the horizontal register shown in FIG. 22.

In addition, as shown in FIG. 13, while the pseudo-horizontal drive pulse φH1a is generated during a horizontal blanking interval, since the pseudo-horizontal drive circuit is connected to the dummy load and the dummy load is connected to GND, the pseudo-horizontal drive pulse φH1a is not applied to the transfer electrodes of the horizontal register. Therefore, a signal charge is prevented from being transferred through the horizontal register during a horizontal blanking interval.

After the horizontal blanking interval, the signal charge transferred to under the transfer electrode 208 of the horizontal register shown in FIG. 22 is transferred through the transfer channel 206 of the horizontal register shown in FIG. 22 by the horizontal drive pulses φH1 and φH2 in opposite phases to each other and is converted into a voltage signal at the charge detecting unit 105.

As shown, during a horizontal blanking interval in which a signal charge is transferred from the vertical register to the horizontal register, the horizontal drive pulses φH1 and φH2 are suspended while the pseudo-horizontal drive pulse φH1a is a pulse successive to the horizontal drive pulse φH1. Therefore, during a horizontal blanking interval, while a current does not flow from the horizontal driver power supply unit 2 to the first and second horizontal drive circuits 3 and 4, a current flows to the pseudo-horizontal drive circuit 6. The current that flows to the pseudo-horizontal drive circuit 6 during the horizontal blanking interval is approximately double the current IH1 or IH2 which flows to the horizontal drive circuit 3 or the horizontal drive circuit 4 during an effective interval in which a signal charge is transferred from the horizontal register 104 to the charge detecting unit 105 by the horizontal drive pulses φH1 and φH2.

Therefore, according to the present fourth embodiment, the current generated at the horizontal driver power supply unit 2 can be arranged to be a constant current. Consequently, according to the present fourth embodiment, even when a reactance component exists on the power supply line to be connected to the horizontal driver power supply unit 2, it is possible to suppress power supply ripples immediately after the start of an effective interval and to suppress occurrences of image degradation such as shading or ringing in an image portion along the left edge of a screen.

Figure 14:
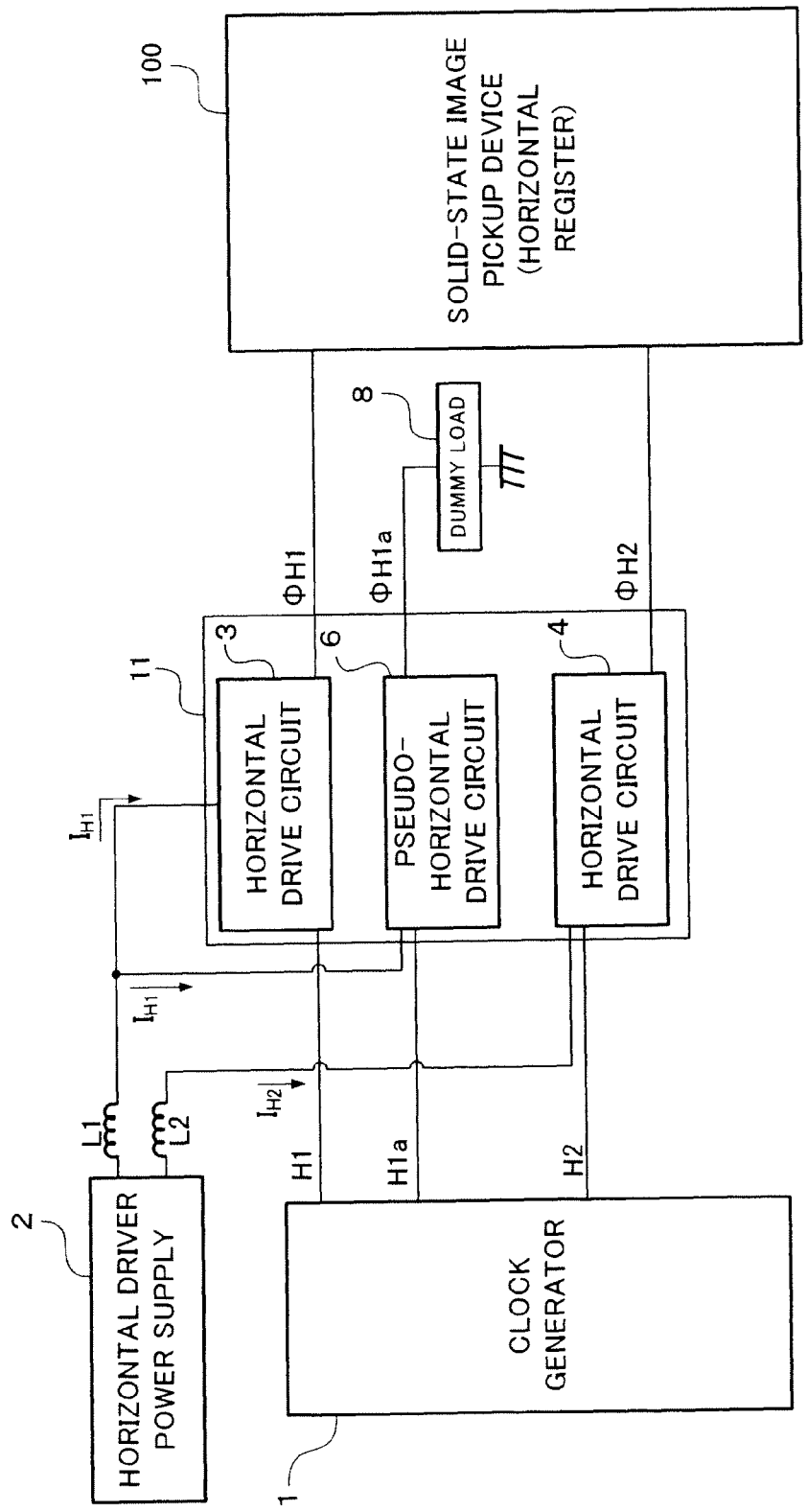
FIG. 14 is a block diagram partially showing a circuit of another example of the solid state image sensor according to the fourth embodiment of the present invention.

While a solid state image sensor in which horizontal drive circuits and a pseudo-horizontal drive circuit are formed on different circuit boards has been described in the present fourth embodiment, as shown in FIG. 14, a configuration can also be adopted in which the horizontal drive circuits 3 and 4 and the pseudo-horizontal drive circuit 6 are formed on the same circuit board (the same chip) 11.

In the circuit shown in FIG. 12, since horizontal drive circuits and a pseudo-horizontal circuit are formed on different circuit boards, a reactance component parasitic on a wire between the horizontal driver power supply unit 2 and the first horizontal drive circuit 3 actually differs from a reactance component parasitic on a wire between the horizontal driver power supply unit 2 and the pseudo-horizontal drive circuit 6. Therefore, in the circuit shown in FIG. 12, the current that flows to the pseudo-horizontal drive circuit 6 during a horizontal blanking interval is not precisely double the current IH1 or IH2 that flows to the horizontal drive circuit 3 or the horizontal drive circuit 4 during an effective interval.

In consideration thereof, as shown in FIG. 14, the current that flows to a pseudo-horizontal drive circuit during a horizontal blanking interval is arranged so as to be double the current that flows to a horizontal drive circuit during an effective interval using a chip on which the horizontal drive circuits and the pseudo-horizontal drive circuit are formed on the same board.

In other words, by using a chip on which horizontal drive circuits and a pseudo-horizontal drive circuit are formed on the same board, the length of the wire between the horizontal driver power supply unit 2 and the first horizontal drive circuit 3 can be more equalized with the length of the wire between the horizontal driver power supply unit 2 and the pseudo-horizontal drive circuit 6. As a result, the reactance component parasitic on the wire between the horizontal driver power supply unit 2 and the first horizontal drive circuit 3 can be more equalized with the reactance component parasitic on the wire between the horizontal driver power supply unit 2 and the pseudo-horizontal drive circuit 6.

Accordingly, the current generated at the horizontal driver power supply unit during an effective interval and the current generated at the horizontal driver power supply unit during a horizontal blanking interval can be more equalized. As a result, it is possible to further suppress disturbances in the phases of horizontal drive pulses immediately after the start of the effective interval and to further suppress occurrences of image degradation such as shading or ringing in an image portion along the left edge of a screen.

Fifth Embodiment

A solid state image sensor according to a fifth embodiment of the present invention will now be described.

Figure 15:
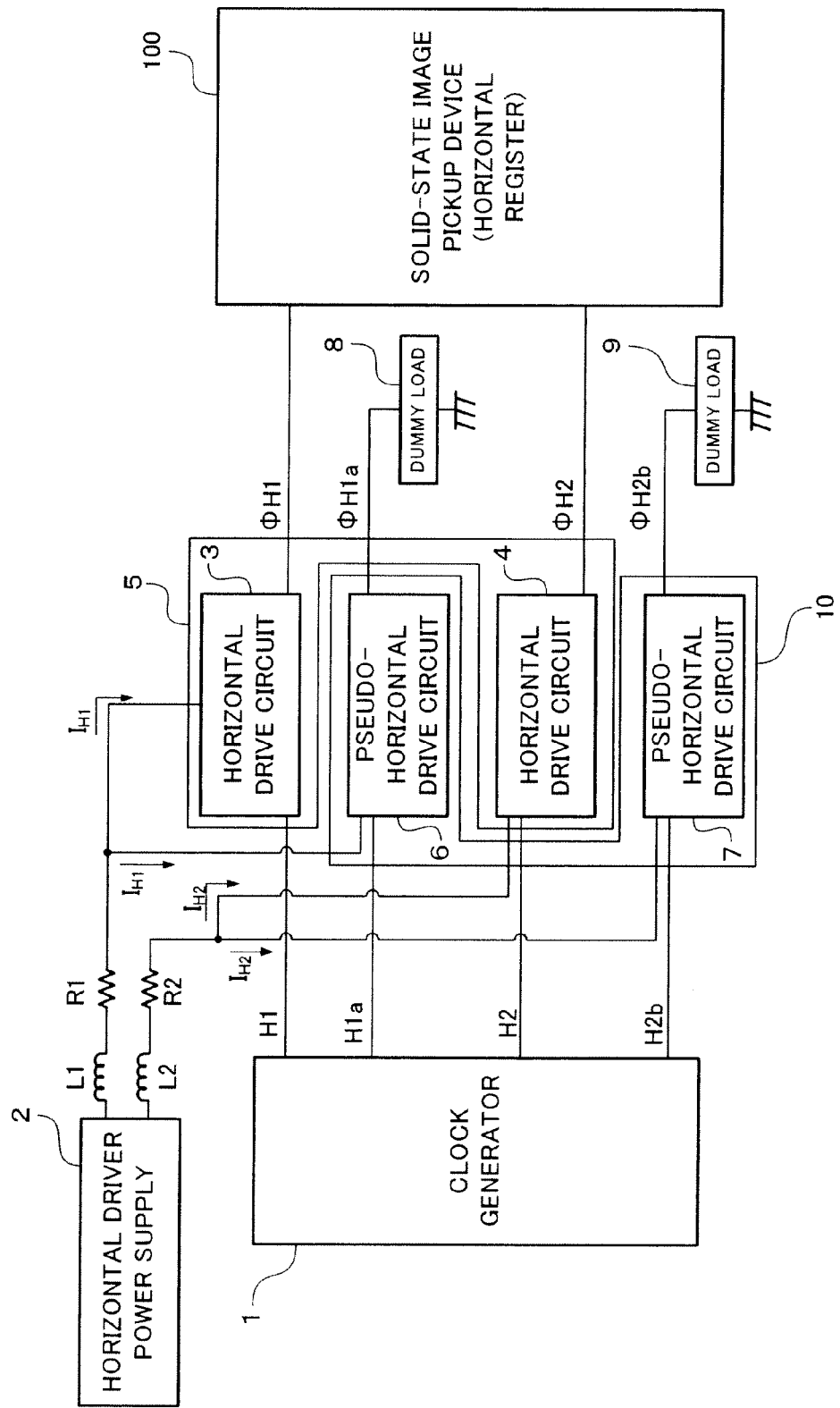
FIG. 15 is a block diagram partially showing a circuit of a first example of a solid state image sensor according to a fifth embodiment of the present invention.

FIG. 15 is a block diagram partially showing a circuit of a first example of the solid state image sensor according to the present fifth embodiment. Members corresponding to members described in the first embodiment mentioned earlier are assigned the same reference characters and detailed descriptions thereof shall be omitted.

In FIG. 15, reference character R1 denotes a resistance component of a wire (power supply line) connecting a power supplying terminal of a horizontal driver power supply unit 2 and power terminals of a first horizontal drive circuit 3 and a first pseudo-horizontal drive circuit 6.

In addition, reference character R2 denotes a resistance component of a wire (power supply line) connecting the power supplying terminal of the horizontal driver power supply unit 2 and power terminals of a second horizontal drive circuit 4 and a second pseudo-horizontal drive circuit 7.

Figure 16:
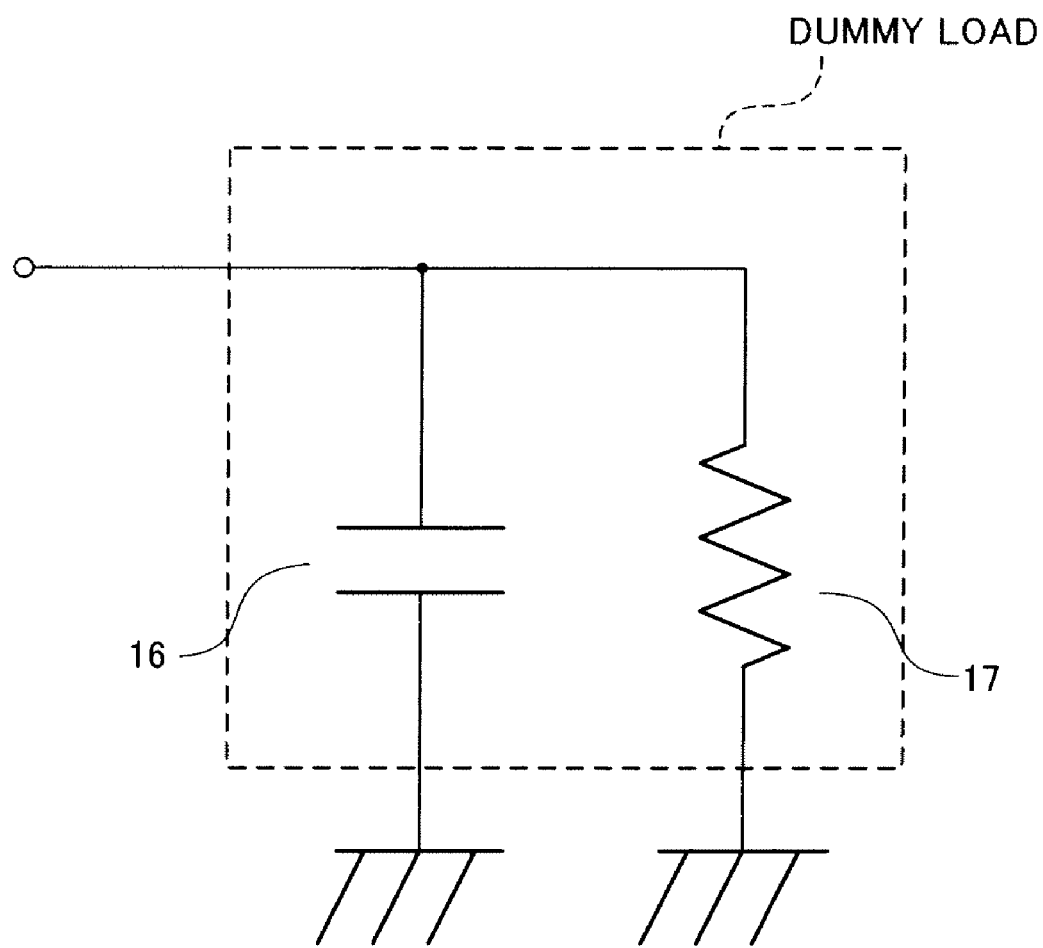
FIG. 16 is a circuit diagram of a dummy load of the solid state image sensor according to the fifth embodiment of the present invention.

FIG. 16 shows an example of a dummy load according to the present fifth embodiment. As shown in FIG. 16, in the present fifth embodiment, a circuit in which a capacitor 16 and a resistor 17 are connected in parallel is used as the dummy load.

As distances from the horizontal driver power supply unit 2 to the horizontal drive circuits 3 and 4 and to the pseudo-horizontal drive circuits 6 and 7 increase, the direct current resistance of the power supply lines becomes nonnegligible. As a result, a difference occurs between a current that flows from the horizontal driver power supply unit 2 to the horizontal drive circuits 3 and 4 during an effective interval and a current that flows from the horizontal driver power supply unit 2 to the pseudo-horizontal drive circuits 6 and 7 during a horizontal blanking interval. At the same time, when a difference occurs between voltage drops by the resistance components R1 and R2 of the power supply lines, a difference occurs between a voltage (terminal voltage) applied to the power terminals of the horizontal drive circuits 3 and 4 during an effective interval and a voltage (terminal voltage) applied to the power terminals of the pseudo-horizontal drive circuits 6 and 7 during a horizontal blanking interval. Accordingly, when a voltage fluctuation occurs immediately after the start of an effective interval in this manner, image degradation such as shading or ringing occurs in an image portion along the left edge of a screen.

In this light, in the first example of the present fifth embodiment, the circuit shown in FIG. 16 in which the capacitor 16 and the resistor 17 are connected in parallel is used as the dummy load 8 to be connected between an output terminal of the first pseudo-horizontal drive circuit 6 and ground and as the dummy load 9 to be connected between an output terminal of the second pseudo-horizontal drive circuit 7 and ground. Through such an arrangement, by adjusting the resistance value of the resistor 17, it is now possible to approximate the current flowing from the horizontal driver power supply unit 2 to the pseudo-horizontal drive circuits 6 and 7 during a horizontal blanking interval to the current flowing from the horizontal driver power supply unit 2 to the horizontal drive circuits 3 and 4 during an effective interval, thereby enabling suppression of image degradation.

Figure 17:
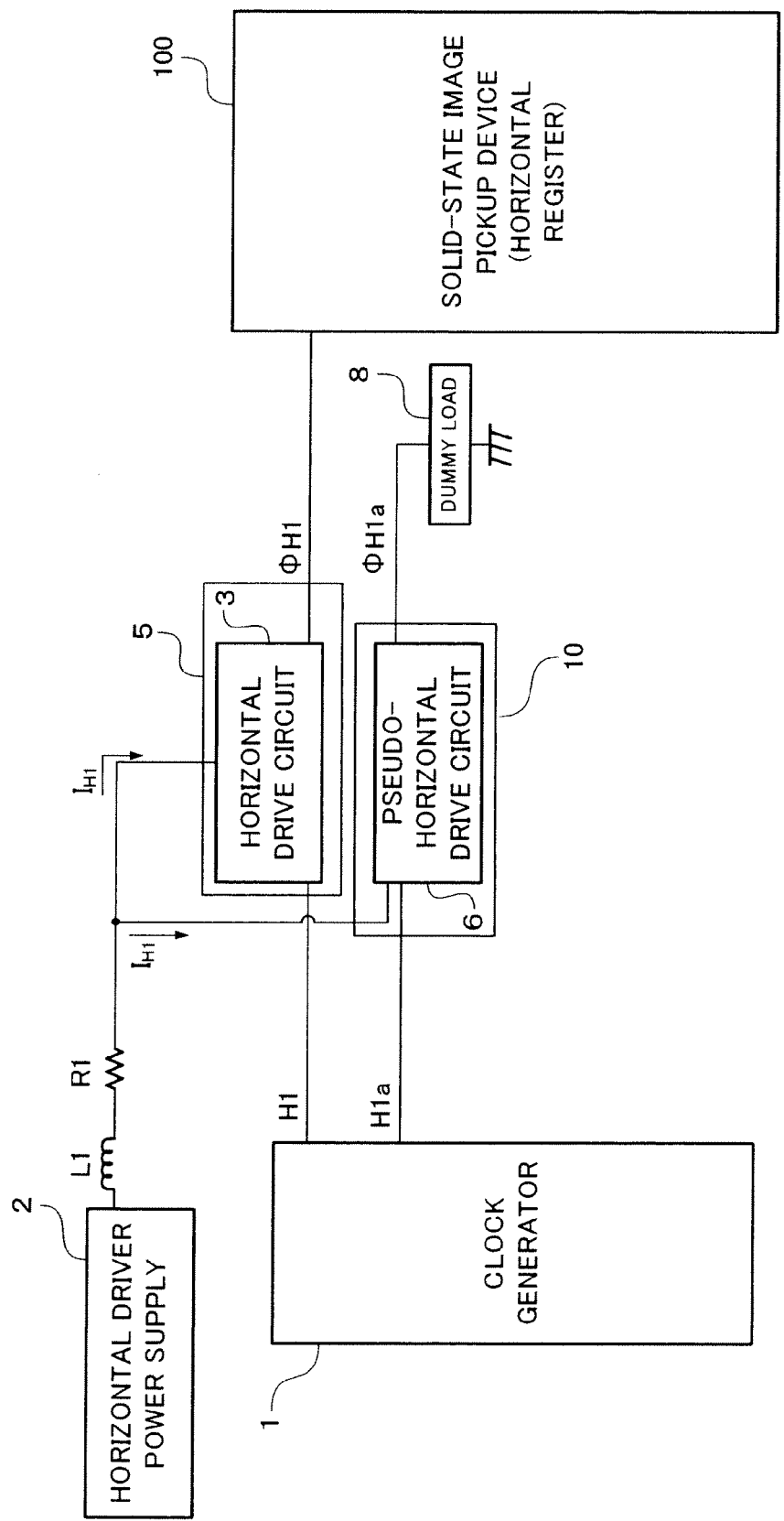
FIG. 17 is a block diagram partially showing a circuit of a second example of the solid state image sensor according to the fifth embodiment of the present invention.

FIG. 17 is a block diagram partially showing a circuit of a second example of the solid state image sensor according to the present fifth embodiment. Members corresponding to members described in the second embodiment mentioned earlier are assigned the same reference characters and detailed descriptions thereof shall be omitted.

In FIG. 17, reference character R1 denotes a resistance component of a wire (power supply line) connecting a power supplying terminal of a horizontal driver power supply unit 2 and power terminals of a horizontal drive circuit 3 and a pseudo-horizontal drive circuit 6.

Also in the second example of the present fifth embodiment, the circuit shown in FIG. 16 in which the capacitor 16 and the resistor 17 are connected in parallel is used as the dummy load 8 to be connected between an output terminal of the pseudo-horizontal drive circuit 6 and ground. Through such an arrangement, by adjusting the resistance value of the resistor 17, it is now possible to approximate the current flowing from the horizontal driver power supply unit 2 to the pseudo-horizontal drive circuit 6 during a horizontal blanking interval to the current flowing from the horizontal driver power supply unit 2 to the horizontal drive circuit 3 during an effective interval, thereby enabling suppression of image degradation.

Figure 18:
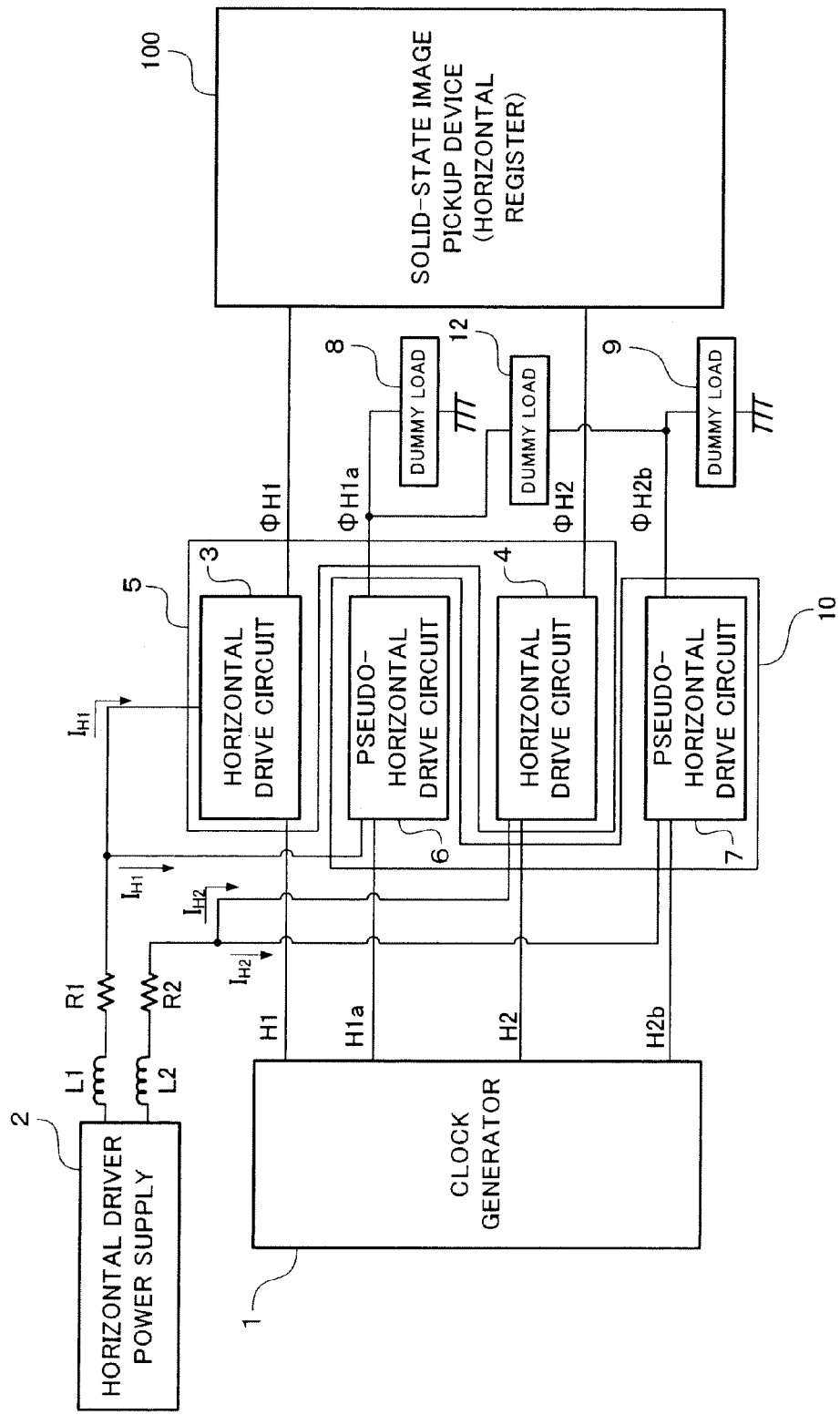
FIG. 18 is a block diagram partially showing a circuit of a third example of the solid state image sensor according to the fifth embodiment of the present invention.

FIG. 18 is a block diagram partially showing a circuit of a third example of the solid state image sensor according to the present fifth embodiment. Members corresponding to members described in the third embodiment mentioned earlier are assigned the same reference characters and detailed descriptions thereof shall be omitted.

In FIG. 18, reference character R1 denotes a resistance component of a wire (power supply line) connecting a power supplying terminal of a horizontal driver power supply unit 2 and power terminals of a first horizontal drive circuit 3 and a first pseudo-horizontal drive circuit 6.

In addition, reference character R2 denotes a resistance components of a wire (power supply line) connecting the power supplying terminal of the horizontal driver power supply unit 2 and power terminals of a second horizontal drive circuit 4 and a second pseudo-horizontal drive circuit 7.

Also in the third example of the present fifth embodiment, the circuit shown in FIG. 16 in which the capacitor 16 and the resistor 17 are connected in parallel is used as the dummy load 8 to be connected between an output terminal of the first pseudo-horizontal drive circuit 6 and ground and as the dummy load 9 to be connected between an output terminal of the second pseudo-horizontal drive circuit 7 and ground. Through such an arrangement, by adjusting the resistance value of the resistor 17, it is now possible to approximate the current flowing from the horizontal driver power supply unit 2 to the pseudo-horizontal drive circuits 6 and 7 during a horizontal blanking interval to the current flowing from the horizontal driver power supply unit 2 to the horizontal drive circuits 3 and 4 during an effective interval, thereby enabling suppression of image degradation.

Figure 19:
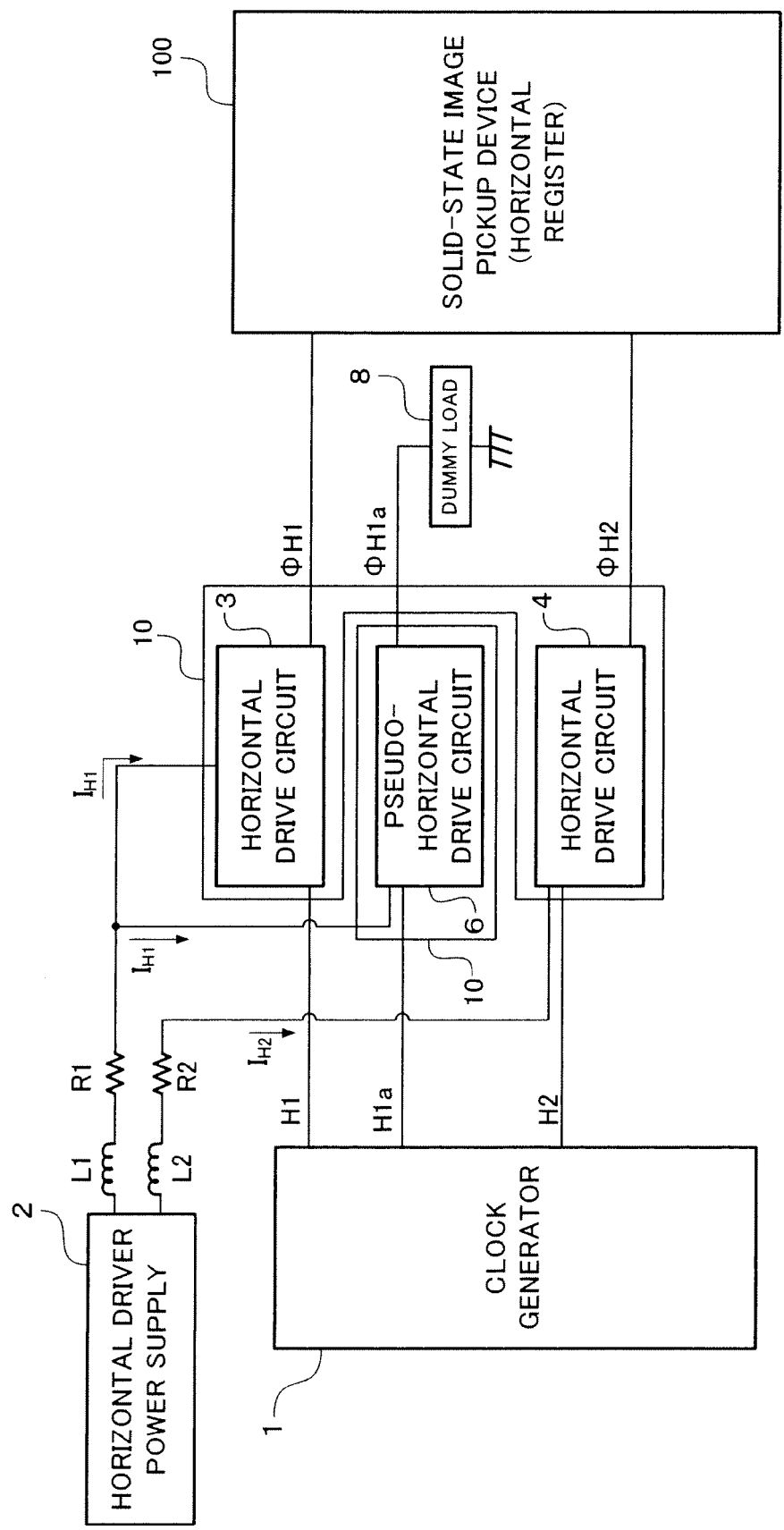
FIG. 19 is a block diagram partially showing a circuit of a fourth example of the solid state image sensor according to the fifth embodiment of the present invention.

FIG. 19 is a block diagram partially showing a circuit of a fourth example of the solid state image sensor according to the present fifth embodiment. Members corresponding to members described in the fourth embodiment mentioned earlier are assigned the same reference characters and detailed descriptions thereof shall be omitted.

In FIG. 19, reference character R1 denotes a resistance component of a wire (power supply line) connecting a power supplying terminal of a horizontal driver power supply unit 2 and power terminals of a first horizontal drive circuit 3 and a pseudo-horizontal drive circuit 6.

Furthermore, reference character R2 denotes a resistance component of a wire (power supply line) connecting the power supplying terminal of the horizontal driver power supply unit 2 and a power terminal of the second horizontal drive circuit 4.

Also in the fourth example of the present fifth embodiment, the circuit shown in FIG. 16 in which the capacitor 16 and the resistor 17 are connected in parallel is used as the dummy load 8 to be connected between an output terminal of the pseudo-horizontal drive circuit 6 and ground. Through such an arrangement, by adjusting the resistance value of the resistor 17, it is now possible to approximate the current flowing from the horizontal driver power supply unit 2 to the pseudo-horizontal drive circuit 6 during a horizontal blanking interval to double the current flowing from the horizontal driver power supply unit 2 to the horizontal drive circuit 3 or the horizontal drive circuit 4 during an effective interval, thereby enabling suppression of image degradation.

While a solid state image sensor in which horizontal drive circuits and pseudo-horizontal drive circuits are formed on different circuit boards has been described in the present fifth embodiment, as described earlier in the first to fourth embodiments, a configuration can also be adopted in which the horizontal drive circuits and the pseudo-horizontal drive circuits are formed on the same circuit board (the same chip).

While a solid state image sensor including two horizontal drive circuits and two pseudo-horizontal drive circuits, a solid state image sensor including one horizontal drive circuit and one pseudo-horizontal drive circuit, and a solid state image sensor including two horizontal drive circuits and one pseudo-horizontal drive circuit have been described as examples in the first to fifth embodiments described above, the numbers of the horizontal drive circuits and the pseudo-horizontal drive circuits are not limited to these examples. For example, when using a four phase-drive horizontal register, providing four horizontal drive circuits and not more than four pseudo-horizontal drive circuits shall suffice.

INDUSTRIAL APPLICABILITY

The solid state image sensor according to the present invention is capable of suppressing occurrences of image degradation such as shading or ringing in an image portion along the left edge of a screen and is useful in electronic devices such as a CCD camera.

The invention claimed is:

1. A solid state image sensor comprising:
a light-receiving unit for converting incident light into a signal charge;
a vertical register for transferring in a first direction a signal charge from the light-receiving unit; and
a horizontal register for transferring in a second direction that differs from the first direction a signal charge transferred by the vertical register;
wherein the solid state image sensor further comprises:
a horizontal drive circuit for generating a horizontal drive pulse for driving the horizontal register;
a dummy load;
a pseudo-horizontal drive circuit for generating a pseudo-horizontal drive pulse successive to the horizontal drive pulse, the pseudo-horizontal drive pulse having a same pulse repetition period as the horizontal drive pulse, and for driving the dummy load during an interval in which the horizontal drive pulse is suspended; and
a power supply unit for connecting to the horizontal drive circuit and the pseudo-horizontal drive circuit.

2. The solid state image sensor according to claim 1, wherein the power supply unit includes a power supplying terminal that for connection to the horizontal drive circuit and to the pseudo-horizontal drive circuit.

3. The solid state image sensor according to claim 1, wherein the number of horizontal drive circuits is the same as the number of pseudo-horizontal drive circuits.

4. The solid state image sensor according to claim 1, wherein the number of pseudo-horizontal drive circuits is less than the number of horizontal drive circuits.

5. The solid state image sensor according to claim 3, wherein the power supply unit includes at least the same number of power supplying terminals as the number of the horizontal drive circuits.

6. The solid state image sensor according to claim 1, comprising a plurality of the pseudo-horizontal drive circuits, wherein the dummy load includes: a first capacitor with one end connected to the pseudo-horizontal drive circuits and the other end grounded; and a second capacitor connected between the respective pseudo-horizontal drive circuits.

7. The solid state image sensor according to claim 1, wherein the dummy load includes a parallel circuit of comprising a capacitor and a resistor and having one end connected to the pseudo-horizontal drive circuit and the other end grounded, the capacitor being equivalent to a transfer electrode of the horizontal register and the resistor being equivalent to a resistance component of a wire connecting the power supply unit and the horizontal drive circuit.

8. The solid state image sensor according to claim 1, wherein the horizontal drive circuit and the pseudo-horizontal drive circuit are on different circuit boards.

9. The solid state image sensor according to claim 1, wherein the horizontal drive circuit and the pseudo-horizontal drive circuit are on a same circuit board.

* * * * *